US012765339B2

(12) United States Patent
Fukuda et al.

(10) Patent No.: US 12,765,339 B2
(45) Date of Patent: Oct. 13, 2026

(54) SEMICONDUCTOR DEVICE AND METHOD OF MANUFACTURING SEMICONDUCTOR DEVICE

(71) Applicant: ROHM CO., LTD., Kyoto (JP)

(72) Inventors: Yoshinori Fukuda, Kyoto (JP); Hajime Okuda, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 905 days.

(21) Appl. No.: 18/090,540

(22) Filed: Dec. 29, 2022

(65) Prior Publication Data

US 2023/0223296 A1 Jul. 13, 2023

(30) Foreign Application Priority Data

Jan. 11, 2022 (JP) ................................ 2022-002636

(51) Int. Cl.

| | |
|---|---|
| ***H10D 30/60*** | (2025.01) |
| ***H10D 64/20*** | (2025.01) |
| ***H10W 10/00*** | (2026.01) |
| ***H10W 10/17*** | (2026.01) |

(52) U.S. Cl.

CPC .......... *H10W 10/014* (2026.01); *H10D 30/60* (2025.01); *H10D 64/20* (2025.01); *H10W 10/17* (2026.01)

(58) Field of Classification Search

CPC ...... H10D 30/60; H10D 64/20; H10D 30/668; H10D 64/117; H10D 62/126; H10D 62/378; H10D 64/518; H10D 84/0188; H10D 84/038; H10D 84/85; H10D 84/856; H10W 10/014; H10W 10/17; H10W 10/041;

(Continued)

(56) References Cited

U.S. PATENT DOCUMENTS 10,707,155 B2 * 7/2020 Okuda .............. H01L 23/49562

FOREIGN PATENT DOCUMENTS

| | | |
|---|---|---|
| JP | 2009004534 A | 1/2009 |
| JP | 2019-71395 A | 5/2019 |

(Continued)

OTHER PUBLICATIONS

Office Action issued on Oct. 9, 2025 in corresponding Japanese patent application No. 2022-002636 (14 pages; with English translation).

(Continued)

*Primary Examiner* — Monica D Harrison

(74) *Attorney, Agent, or Firm* — XSENSUS LLP

(57) ABSTRACT

A semiconductor device includes: a semiconductor layer having a partitioned region partitioned by a trench; a field insulating layer which is formed on a main surface of the semiconductor layer at an interval from the trench toward an inner side of the partitioned region and covers the partitioned region; a trench insulating layer formed at least in the trench; an intermediate region annularly formed between the field insulating layer on the main surface of the semiconductor layer and the trench insulating layer; and a bridge insulating layer which is formed in the intermediate region and connects the field insulating layer and the trench insulating layer, wherein the bridge insulating layer has a bridge buried portion buried in the main surface of the semiconductor layer.

15 Claims, 25 Drawing Sheets

(58) Field of Classification Search
CPC ........... H10W 10/0121; H10W 70/466; H10W 70/481; H10W 10/13; H10W 10/40
USPC .......................................................... 257/510
See application file for complete search history.

(56) References Cited

FOREIGN PATENT DOCUMENTS

| | | | |
|---|---|---|---|
| JP | 2020107670 | A | 7/2020 |
| WO | 2011111500 | A1 | 9/2011 |

OTHER PUBLICATIONS

Office Action issued on Feb. 19, 2026 in corresponding Japanese patent application No. JP 2022-002636 (6 pages; with English translation).

* cited by examiner

SEMICONDUCTOR DEVICE AND METHOD OF MANUFACTURING SEMICONDUCTOR DEVICE

CROSS-REFERENCE TO RELATED APPLICATION

This application is based upon and claims the benefit of priority from Japanese Patent Application No. 2022-002636, filed on Jan. 11, 2022, the entire contents of which are incorporated herein by reference.

TECHNICAL FIELD

The present disclosure relates to a semiconductor device and a method of manufacturing the same.

BACKGROUND

In the related art, there is disclosed a semiconductor device that includes a semiconductor layer having an n-type MIS region partitioned by a first trench, a first trench insulating layer formed in the first trench, a first field insulating layer formed on a first main surface of the semiconductor layer at an interval from the first trench to the inner side of the n-type MIS region with a gap therebetween and covering the n-type MIS region, and a first bridge insulating layer formed in a region between the first trench and the first field insulating layer on the first main surface of the semiconductor layer and connected to the first trench insulating layer and the first field insulating layer.

SUMMARY

Some embodiments of the present disclosure provide a semiconductor device capable of suppressing crystal defects in a semiconductor layer and achieving miniaturization, and a method of manufacturing the same.

According to one embodiment of the present disclosure, there is provided a semiconductor device that includes: a semiconductor layer having a partitioned region partitioned by a trench; a field insulating layer which is formed on a main surface of the semiconductor layer at an interval from the trench toward an inner side of the partitioned region and covers the partitioned region; a trench insulating layer formed at least in the trench; an intermediate region annularly formed between the field insulating layer on the main surface of the semiconductor layer and the trench insulating layer; and a bridge insulating layer which is formed in the intermediate region and connects the field insulating layer and the trench insulating layer, wherein the bridge insulating layer has a bridge buried portion buried in the main surface of the semiconductor layer

DETAILED DESCRIPTION

Embodiments of the present disclosure will now be described in detail with reference to the accompanying drawings.

Figure 1:
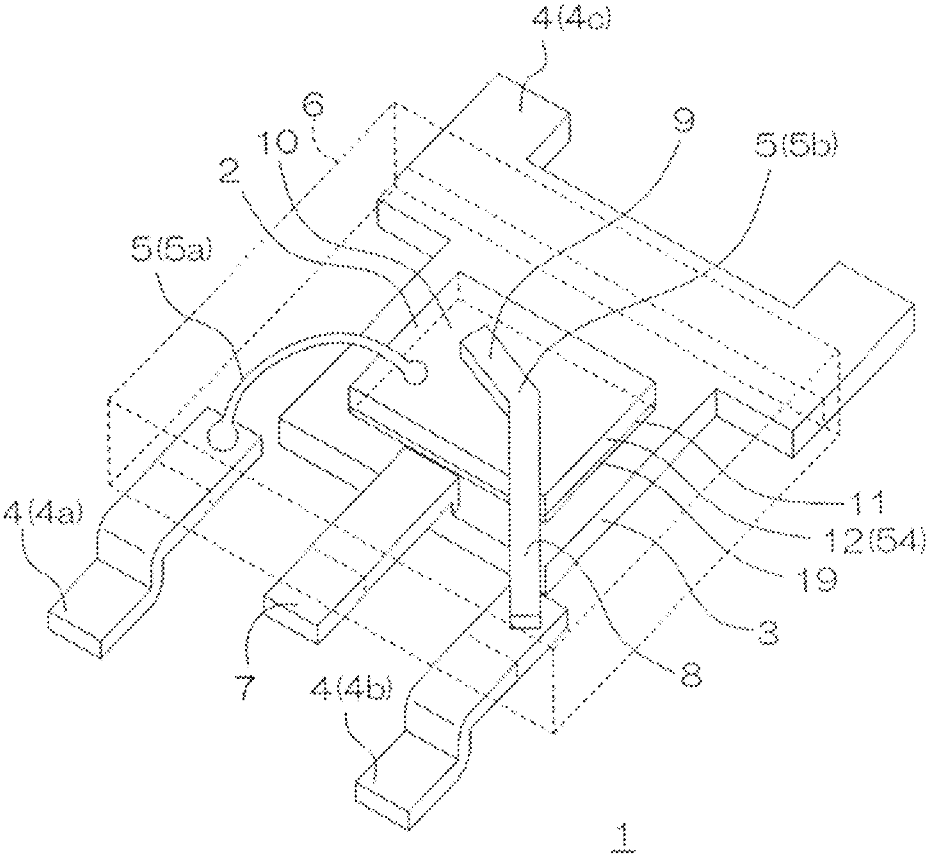
FIG. 1 is a schematic perspective view of a semiconductor device according to an embodiment of the present disclosure.
Figure 2:
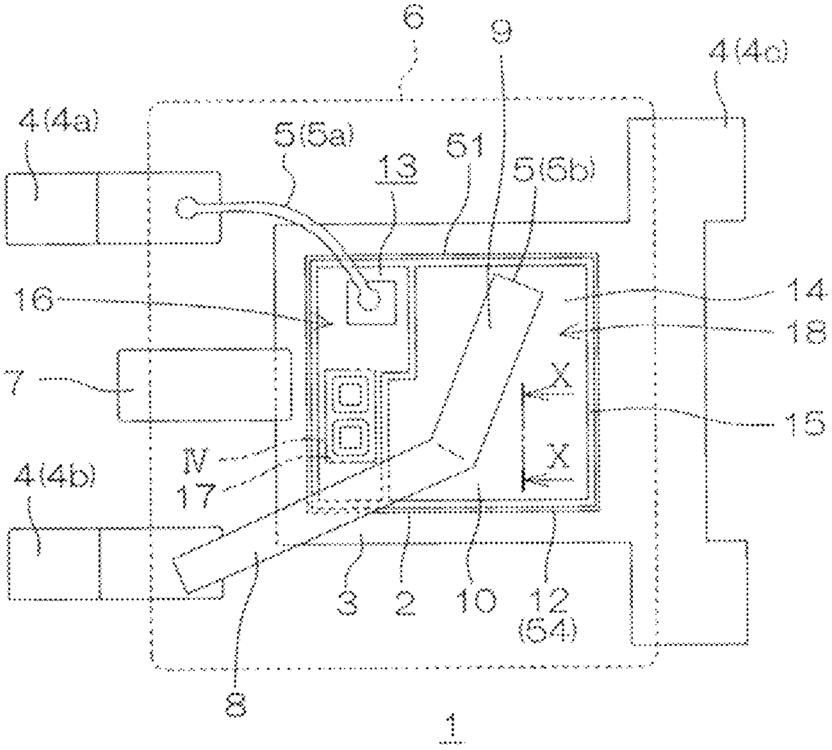
FIG. 2 is a schematic plan view showing an internal structure of the semiconductor device.

FIG. 1 is a schematic perspective view of a semiconductor device 1 according to an embodiment of the present disclosure. In FIG. 1, a resin package 6 is transparently shown for clarity. FIG. 2 is a schematic plan view showing an internal structure of the semiconductor device 1.

Referring to FIG. 1, in this embodiment, the semiconductor device 1 is an electronic component to which a TO (Transistor Outline)-type package represented by TO-220 and TO-252 is applied as a package type. In this embodiment, TO-252 is applied as the package type.

The semiconductor device 1 includes an IPD (Intelligent Power Device) chip 2 as an example of a semiconductor chip, a die pad 3, a plurality of lead terminals 4 (three lead terminals 4 in this embodiment), a plurality of conducting wires 5, and a resin package 6.

The IPD chip 2 is formed in a rectangular parallelepiped shape. The IPD chip 2 has a first chip main surface 10 on one side, a second chip main surface 11 on the other side, and a chip side surface 12 connecting the first chip main surface 10 and the second chip main surface 11. The first chip main surface 10 and the second chip main surface 11 are electrode surfaces on which electrodes are respectively formed. That is, the IPD chip 2 is a semiconductor chip having a vertical structure.

Referring to FIG. 2, the IPD chip 2 includes an input region 13 and an output region 14. The input region 13 and the output region 14 are each partitioned by an element isolation structure 15. Although detailed description is omitted, the element isolation structure 15 may have a trench insulation structure in which a trench is filled with an insulator.

The input region 13 includes a control IC 16. The input region 13 includes a CMIS (Complementary Metal Insulator Semiconductor) region 17 in which a CMIS is formed. A specific structure of the CMIS region 17 will be described later. The output region 14 includes an output power MISFET (Metal Insulator Semiconductor Field Effect Transistor) 18 as an example of an insulated gate field effect transistor. The output power MISFET 18 is controlled by the control IC 16.

An area S1 of the output region 14 is equal to or larger than an area S2 of the input region 13 ($S2 \leq S1$) in a plan view seen from the normal direction of the first chip main surface 10. A ratio S1/S2 of the area 51 to the area S2 may exceed 1 and be 10 or less ($1 < S1/S2 \leq 10$). The planar shape of the input region 13 and the planar shape of the output region 14 are arbitrary and are not limited to specific shapes.

The die pad 3 is formed in a rectangular parallelepiped shape. The die pad 3 supports the IPD chip 2 from the second chip main surface 11 side. The die pad 3 is connected to the IPD chip 2 via a conductive bonding material 19. The conductive bonding material 19 may be metallic paste or solder.

The plurality of lead terminals 4 functions as external terminals for external connection. The plurality of lead terminals 4 is provided around the die pad 3. In this embodiment, the plurality of lead terminals 4 includes a first lead terminal 4*a*, a second lead terminal 4*b*, and a third lead terminal 4*c*.

The first lead terminal 4*a* and the second lead terminal 4*b* are arranged along one side (first side) of the die pad 3. The first lead terminal 4*a* and the second lead terminal 4*b* are each arranged at an interval from the die pad 3. The first lead terminal 4*a* and the second lead terminal 4*b* are each formed in a strip shape extending in a direction orthogonal to the arrangement direction.

The third lead terminal 4*c* is formed integrally with the die pad 3. The third lead terminal 4*c* is drawn out in a rectangular shape from a side (second side) opposite to the one side (first side) of the die pad 3. In a plan view seen from the normal direction of the first chip main surface 10, a notched recess recessed toward the die pad 3 is formed in the central portion of the third lead terminal 4*c*.

The first lead terminal 4*a* and the second lead terminal 4*b* are electrically connected to arbitrary regions of the IPD chip 2 via the conducting wires 5, respectively. The conducting wires 5 may include bonding wires. The conducting wires 5 may contain aluminum. More specifically, the conducting wires 5 include a first conducting wire 5*a* and a second conducting wire 5*b*. The first conducting wire 5*a* electrically connects the first lead terminal 4*a* to the input region 13. The second conducting wire 5*b* electrically connects the second lead terminal 4*b* to the output region 14.

The second conducting wire 5*b* connected to the output region 14 is thicker than the first conducting wire 5*a* connected to the input region 13. A connection area of the second conducting wire 5*b* with respect to the output region 14 is larger than a connection area of the first conducting wire 5*a* with respect to the input region 13. As a result, heat generated in the output region 14 can be appropriately dissipated to an outside through the second conducting wire 5*b*.

In this embodiment, the second conducting wire 5*b* includes a bridge portion 8 and a connection portion 9. The bridge portion 8 is installed in a region between the second lead terminal 4*b* and the output region 14. The bridge portion 8 includes one end portion positioned on the second lead terminal 4*b* and the other end portion positioned on the output region 14.

The connection portion 9 is drawn out from the other end portion of the bridge portion 8 to a region on the output region 14 so as to be connected to the output region 14. The connection portion 9 extends along a second direction inclined by a predetermined angle with respect to a first direction in which the bridge portion 8 extends, so as to extend along the output region 14 in a plan view seen from the normal direction of the first chip main surface 10. When a direction in which the output region 14 extends substantially matches the direction in which the bridge portion 8 extends, the second direction may substantially match the first direction.

By designing the second conducting wire 5*b* separately into the bridge portion 8 and the connection portion 9, a connection area of the connection portion 9 with respect to the output region 14 can be secured regardless of the direction in which the bridge portion 8 extends. As a result, the heat generated in the output region 14 can be appropriately dissipated to the outside through the second conducting wire 5*b*.

A frame portion 7 is provided in a region between the first lead terminal 4*a* and the second lead terminal 4*b*. The frame portion 7 is drawn out from the die pad 3. The frame portion 7 extends along a direction orthogonal to the arrangement direction of the first lead terminal 4*a* and the second lead terminal 4*b*. The frame portion 7 is a residual portion of the lead frame which supported the die pad 3 during a manufacturing process.

The resin package 6 is formed in a rectangular parallelepiped shape. The resin package 6 contains a sealing resin. The sealing resin may be an epoxy resin. The resin package 6 seals the IPD chip 2, the die pad 3, the plurality of lead terminals 4, and the frame portion 7. A back surface of the die pad 3 is exposed from the resin package 6. The back surface of the die pad 3 is a surface opposite to the surface supporting the IPD chip 2. The plurality of lead terminals 4 is drawn out from an inside of the resin package 6 to an outside of the resin package 6. The frame portion 7 is drawn out from the inside of the resin package 6 to the outside of the resin package 6.

Figure 3:
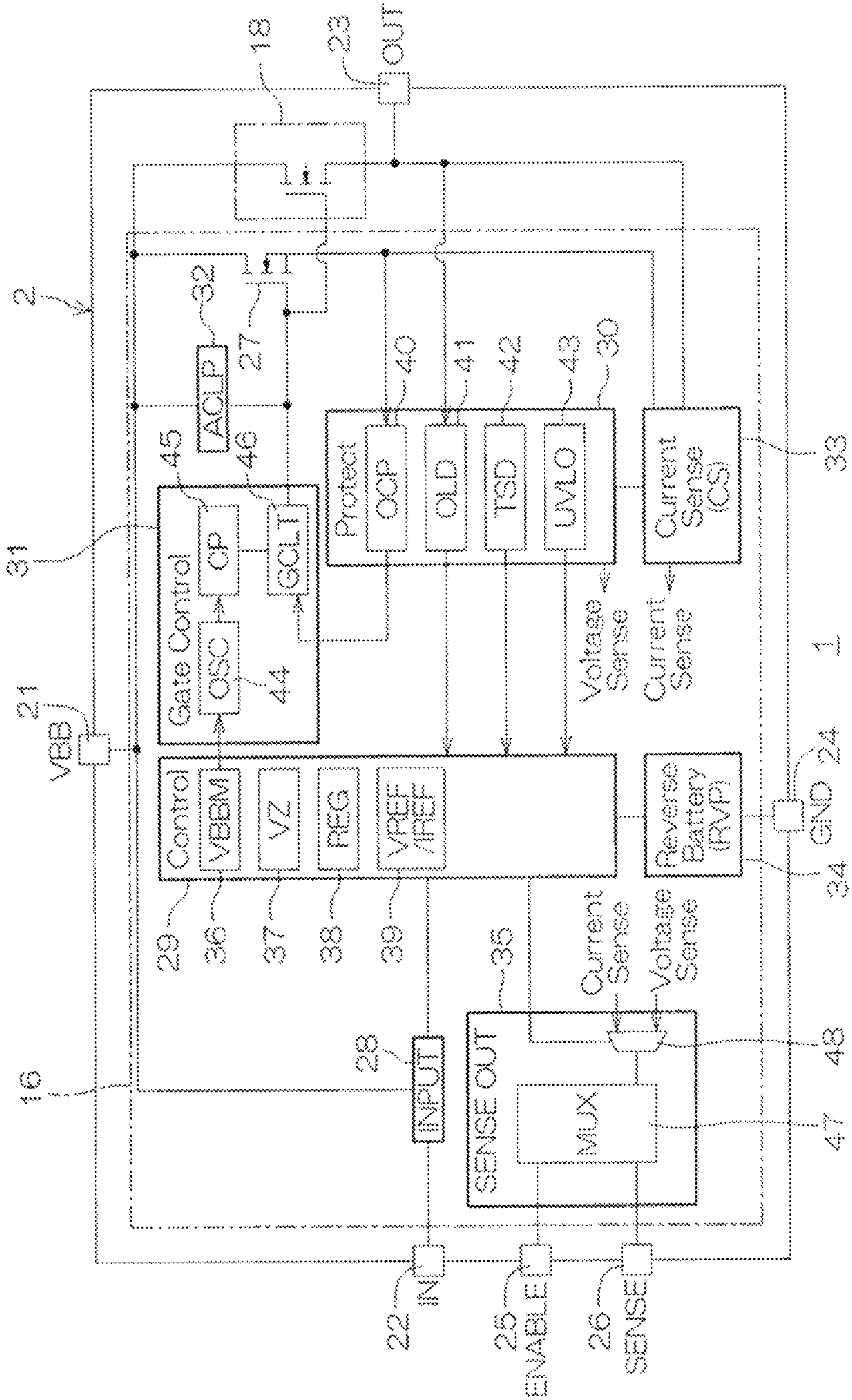
FIG. 3 is a block circuit diagram showing an electrical structure of an IPD chip of FIG. 1.

FIG. 3 is a block circuit diagram showing an electrical structure of the IPD chip 2 shown in FIG. 1. A case where the semiconductor device 1 is mounted in a vehicle will be described below as an example.

Referring to FIG. 3, the IPD chip 2 includes a main power supply terminal part 21, an input terminal part 22, an output terminal part 23, a ground terminal part 24, an ENABLE terminal part 25, and a SENSE terminal part.

The main power supply terminal part 21 may be connected to a battery. A main voltage of about 12V to 14V may be applied to the main power supply terminal part 21. The main power supply terminal part 21 provides the main voltage to various circuit parts within the IPD chip 2.

The input terminal part 22 may be connected to a micro-controller unit, a DC/DC converter, an LDO (Low Drop Out), and the like. An input voltage of 5V may be applied to the input terminal part 22. The output terminal part 23 is connected to a load. The ground terminal part 24 provides a ground voltage to various circuit parts within the IPD chip 2.

The ENABLE terminal part 25 may be connected to the microcontroller unit. A control signal for controlling drive and stop of the IPD chip 2 may be input to the ENABLE terminal part 25. The SENSE terminal part 26 may be connected to a resistor.

The control IC 16 of the IPD chip 2 includes a sensor MISFET 27, an input circuit part 28, a voltage control circuit part 29, a protection circuit part 30, a gate drive control circuit part 31, an active clamp circuit part 32, a current detection circuit part 33, a battery reverse connection protection circuit part 34, and an abnormality detection circuit part 35.

The output power MISFET 18 of the IPD chip 2 includes a gate, a drain, and a source. The gate of the output power MISFET 18 is connected to the control IC 16 (more specifically, the gate drive control circuit part 31).

The drain of the output power MISFET 18 is connected to the main power supply terminal part 21. The source of the output power MISFET 18 is connected to the control IC 16 (more specifically, the current detection circuit part 33) and the output terminal part 23.

The sensor MISFET 27 includes a gate, a drain, and a source. The gate of the sensor MISFET 27 is connected to the gate drive control circuit part 31. The drain of the sensor MISFET 27 is connected to the main power supply terminal part 21. The source of the sensor MISFET 27 is connected to the current detection circuit part 33.

The input circuit part 28 is connected to the input terminal part 22 and the voltage control circuit part 29. The input circuit part 28 may include a Schmitt trigger circuit. The input circuit part 28 shapes a waveform of a voltage signal applied to the input terminal part 22. A signal generated by the input circuit part 28 is input to the voltage control circuit part 29.

The voltage control circuit part 29 is connected to the gate drive control circuit part 31, the protection circuit part 30, the battery reverse connection protection circuit part 34, and the abnormality detection circuit part 35. The voltage control circuit part 29 generates various voltages according to a signal from the input circuit part 28 and a signal from the protection circuit part 30.

In this embodiment, the voltage control circuit part 29 includes a drive voltage circuit part 36, a first constant voltage circuit part 37, a second constant voltage circuit part 38, and a reference voltage/reference current circuit part 39.

The drive voltage circuit part 36 generates a drive voltage for driving the gate drive control circuit part 31. The drive voltage may be set to a value obtained by subtracting a predetermined value from the main voltage. The drive voltage may be set to about 7V to 9V, which is obtained by subtracting 5V from the main voltage. The drive voltage is input to the gate drive control circuit part 31.

The first constant voltage circuit part 37 generates a first constant voltage for driving the protection circuit part 30. The first constant voltage may be about 5V. The first constant voltage circuit part 37 may include a Zener diode. The first constant voltage generated by the first constant voltage circuit part 37 is input to the protection circuit part 30 (more specifically, a load open detection circuit part 41 and the like, which will be described later).

The second constant voltage circuit part 38 generates a second constant voltage for driving the protection circuit part 30. The first constant voltage may be about 5V. The second constant voltage circuit part 38 may include a regulator circuit. The second constant voltage generated by the second constant voltage circuit part 38 is input to the protection circuit part 30 (more specifically, an overheat protection circuit part 42 and a low voltage malfunction prevention circuit part 43, which will be described later).

The reference voltage/reference current circuit part 39 generates a reference voltage and a reference current for various circuit parts. The reference voltage may be about 5V. The reference current may range from several mA to hundreds of mA. The reference voltage and the reference current generated by the reference voltage/reference current circuit part 39 are input to various circuit parts. When the various circuit parts include a comparator, the reference voltage and the reference current are input to the comparator.

The protection circuit part 30 is connected to the gate drive control circuit part 31, the abnormality detection circuit part 35, the source of the sensor MISFET 27, and the source of the output power MISFET 18. The protection circuit part 30 includes an overcurrent protection circuit part 40, the load open detection circuit part 41, the overheat protection circuit part 42, and the low voltage malfunction prevention circuit part 43.

The overcurrent protection circuit part 40 is connected to the gate drive control circuit part 31 and the source of the sensor MISFET 27. The overcurrent protection circuit part 40 protects the output power MISFET 18 from overcurrent. The overcurrent protection circuit part 40 may include a current monitor circuit. A signal generated by the overcurrent protection circuit part 40 is input to the gate drive control circuit part 31 (more specifically, a drive signal output circuit part 46 which will be described later).

The load open detection circuit part 41 is connected to the voltage control circuit part 29 and the source of the output power MISFET 18. The load open detection circuit part 41 detects a short-circuit state and an open state of the output power MISFET 18. A signal generated by the load open detection circuit part 41 is input to the voltage control circuit part 29.

The overheat protection circuit part 42 monitors a temperature of the IPD chip 2. The overheat protection circuit part 42 may include a temperature sensitive device such as a thermistor. The overheat protection circuit part 42 protects the output power MISFET 18 from an excessive temperature rise. A signal generated by the overheat protection circuit part 42 is input to the voltage control circuit part 29.

The low voltage malfunction prevention circuit part 43 prevents a malfunction of the output power MISFET 18 when the main voltage is less than a predetermined value. A signal generated by the low voltage malfunction prevention circuit part 43 is input to the voltage control circuit part 29.

A voltage of the protection circuit part 30 is monitored by the abnormality detection circuit part 35. In the protection circuit part 30, if any one of the overcurrent protection circuit part 40, the load open detection circuit part 41, the overheat protection circuit part 42, and the low voltage malfunction prevention circuit part 43 malfunctions, fluctuation occurs in the voltage of the protection circuit part 30. The voltage of the protection circuit part 30 after fluctuation is input to the abnormality detection circuit part 35, as a voltage detection signal.

The gate drive control circuit part 31 is connected to the gate of the output power MISFET 18 and the gate of the sensor MISFET 27. The gate drive control circuit part 31 generates a gate drive signal according to a signal from the voltage control circuit part 29 and a signal from the protection circuit part 30. The gate drive signal is a signal for turning on/off the gate of the output power MISFET 18 and the gate of the sensor MISFET 27. The gate drive signal from the gate drive control circuit part 31 is input to the gate of the output power MISFET 18 and the gate of the sensor MISFET 27.

More specifically, the gate drive control circuit part 31 includes an oscillation circuit part 44, a charge pump circuit part 45, and a drive signal output circuit part 46.

The oscillation circuit part 44 oscillates in response to the signal from the voltage control circuit part 29. A signal generated by the oscillation circuit part 44 is input to the charge pump circuit part 45. The charge pump circuit part 45 boosts the signal of the oscillation circuit part 44. A signal generated by the charge pump circuit part 45 is input to the drive signal output circuit part 46.

The drive signal output circuit part 46 generates a gate drive signal according to the signal of the charge pump circuit part 45 and the signal of the protection circuit part 30 (more specifically, the overcurrent protection circuit part 40). The gate drive signal generated by the drive signal output circuit part 46 is input to the gate of the output power MISFET 18 and the gate of the sensor MISFET 27. As a result, the sensor MISFET 27 and the output power MISFET 18 are simultaneously driven and controlled.

The active clamp circuit part 32 is connected to the main power supply terminal part 21, the gate of the output power MISFET 18, and the gate of the sensor MISFET 27. The active clamp circuit part 32 protects the output power MISFET 18 from a surge voltage. The surge voltage may include a turn-off surge voltage which can be generated when a voltage applied to the main power supply terminal part 21 is switched off.

The active clamp circuit part 32 may include two diodes reverse-biased to each other. The two diodes may include a Zener diode and a pn junction diode.

The current detection circuit part 33 is connected to the source of the sensor MISFET 27 and the source of the output power MISFET 18. The current detection circuit part 33 generates a current detection signal according to a signal generated by the sensor MISFET 27 and a signal generated by the output power MISFET 18. The current detection signal generated by the current detection circuit part 33 is input to the abnormality detection circuit part 35.

The battery reverse connection protection circuit part 34 is connected to the ground terminal part 24 and the gate drive control circuit part 31. The battery reverse connection protection circuit part 34 protects the voltage control circuit part 29, the output power MISFET 18, etc. from a reverse voltage when a battery is connected in reverse.

The abnormality detection circuit part 35 includes a first multiplexer circuit part 47 and a second multiplexer circuit part 48. The first multiplexer circuit part 47 includes two inputs and one output. The second multiplexer circuit part 48 includes two inputs, one output, and one select control input.

The inputs of the first multiplexer circuit part 47 are connected to the ENABLE terminal part 25 and the output of the second multiplexer circuit part 48, respectively. The SENSE terminal part 26 is connected to the output of the first multiplexer circuit part 47.

The inputs of the second multiplexer circuit part 48 are connected to the protection circuit part 30 and the current detection circuit part 33, respectively. The SENSE terminal part 26 is connected to the output of the second multiplexer circuit part 48. The voltage control circuit part 29 is connected to the selection control input of the second multiplexer circuit part 48. The second multiplexer circuit part 48 generates an abnormality detection signal according to a signal from the voltage control circuit part 29, a voltage detection signal from the protection circuit part 30, and a current detection signal from the current detection circuit part 33. The abnormality detection signal generated by the second multiplexer circuit part 48 is input to the first multiplexer circuit part 47.

For example, when an ON signal is input from the microcontroller unit to the ENABLE terminal part 25, the abnormality detection signal is taken out from the SENSE terminal part 26, as an abnormality detection current signal. The abnormality detection current signal is converted to a voltage signal by a resistor externally attached to the SENSE terminal part 26. A status abnormality of the IPD chip 2 is detected based on this voltage signal.

Figure 4:
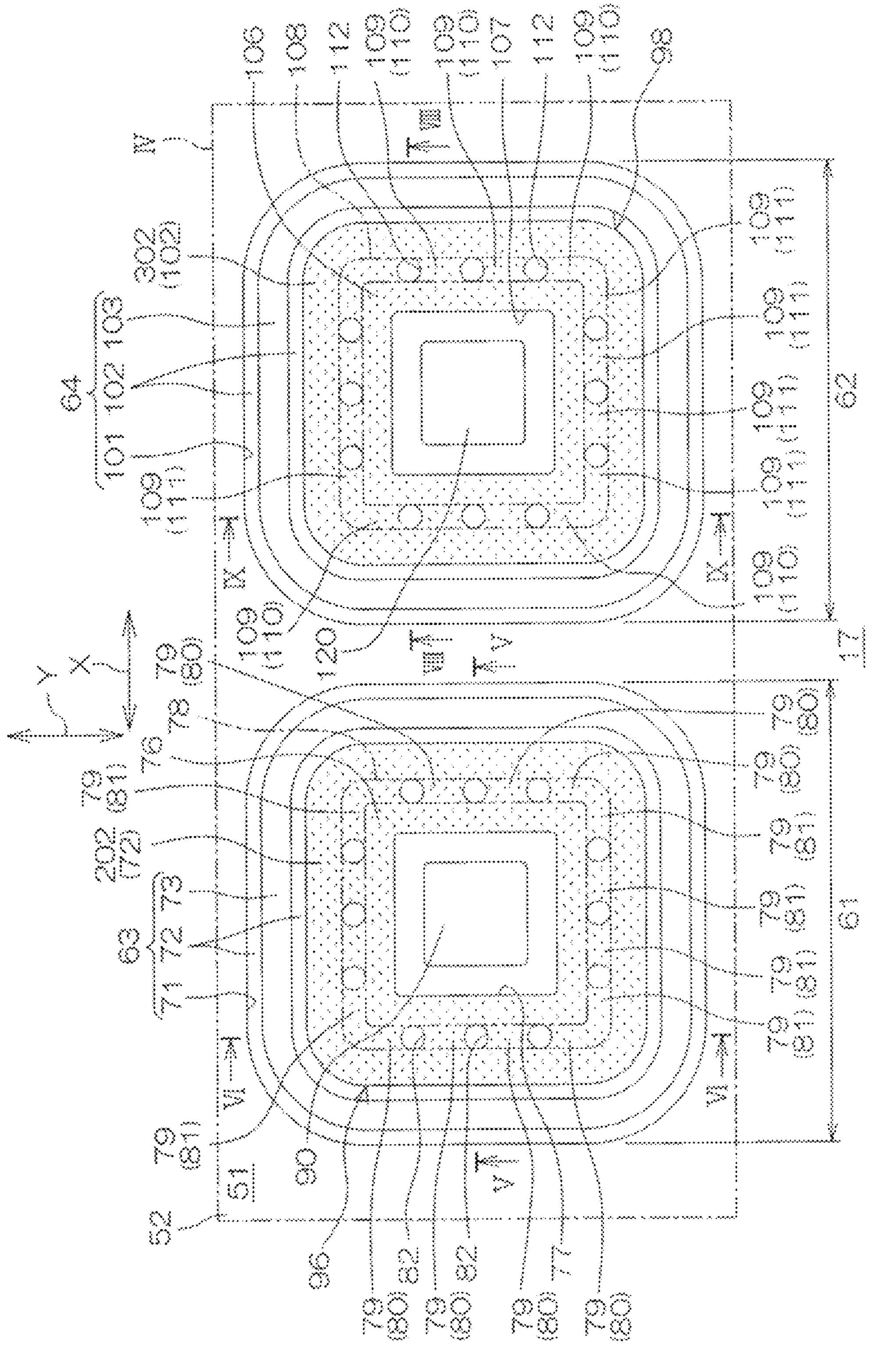
FIG. 4 is an enlarged view of region IV in FIG. 2.
Figure 5:
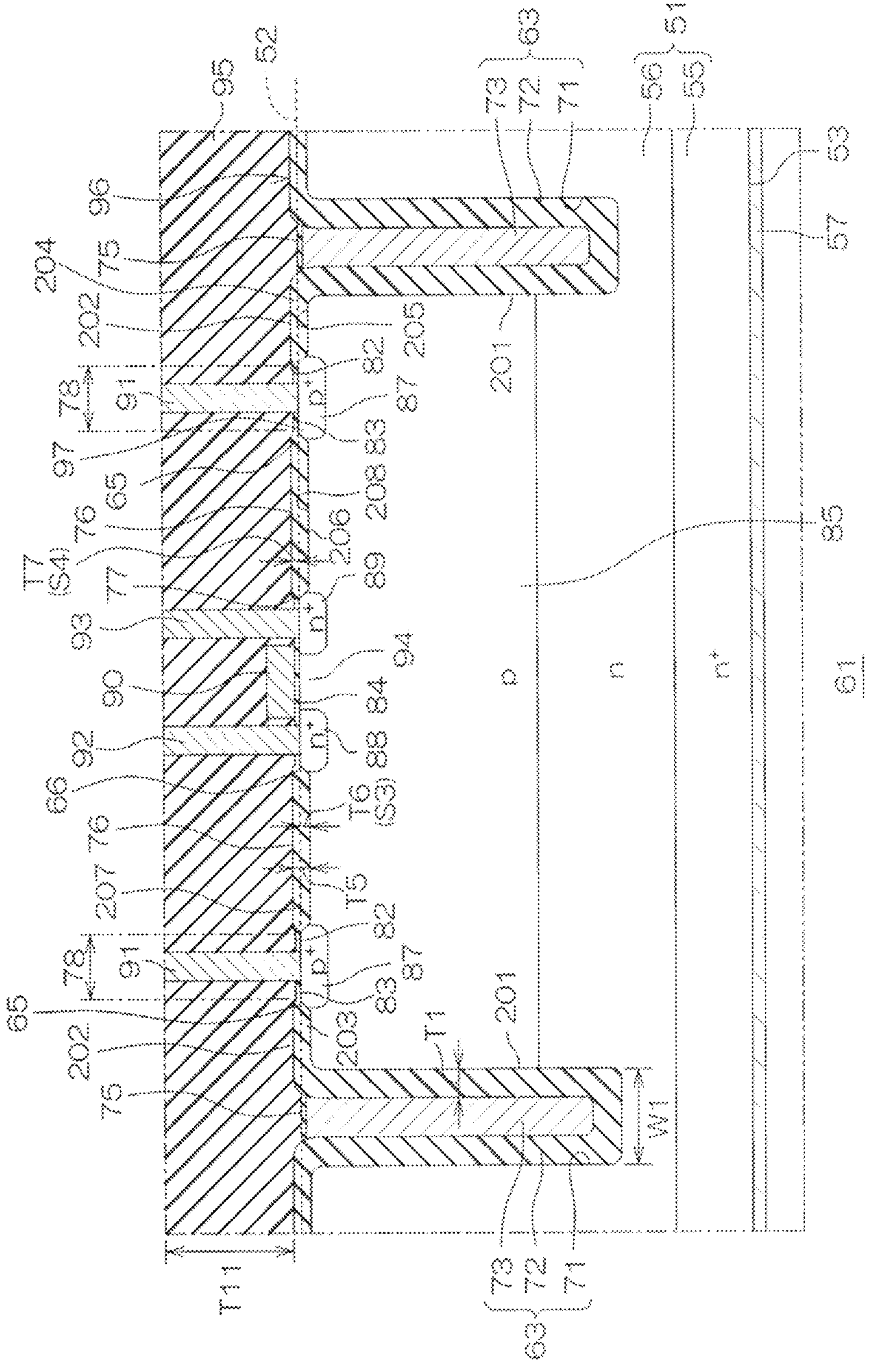
FIG. 5 is a cross-sectional view taken along line V-V in FIG. 4.
Figure 6:
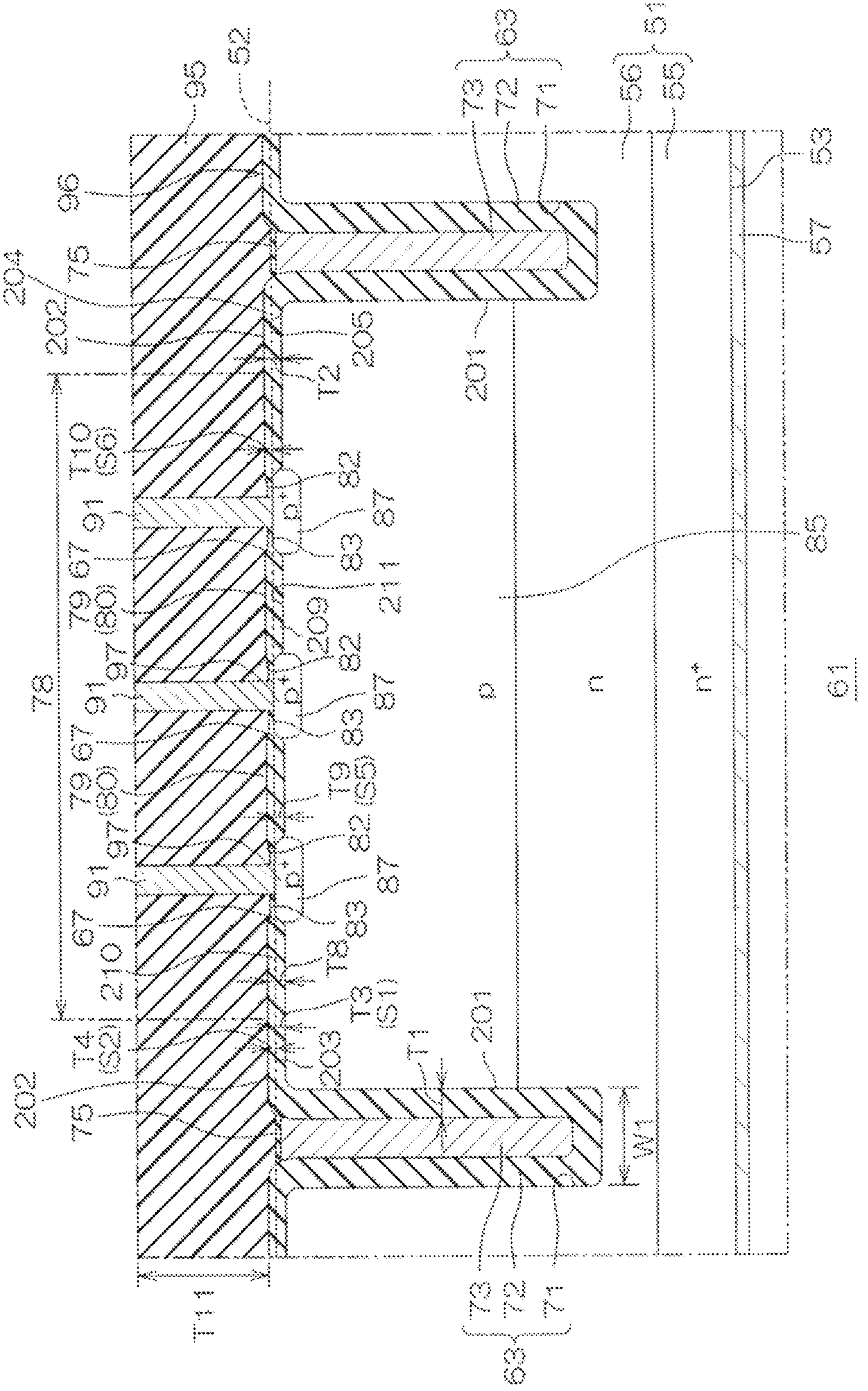
FIG. 6 is a cross-sectional view taken along line VI-VI in FIG. 4.
Figure 7:
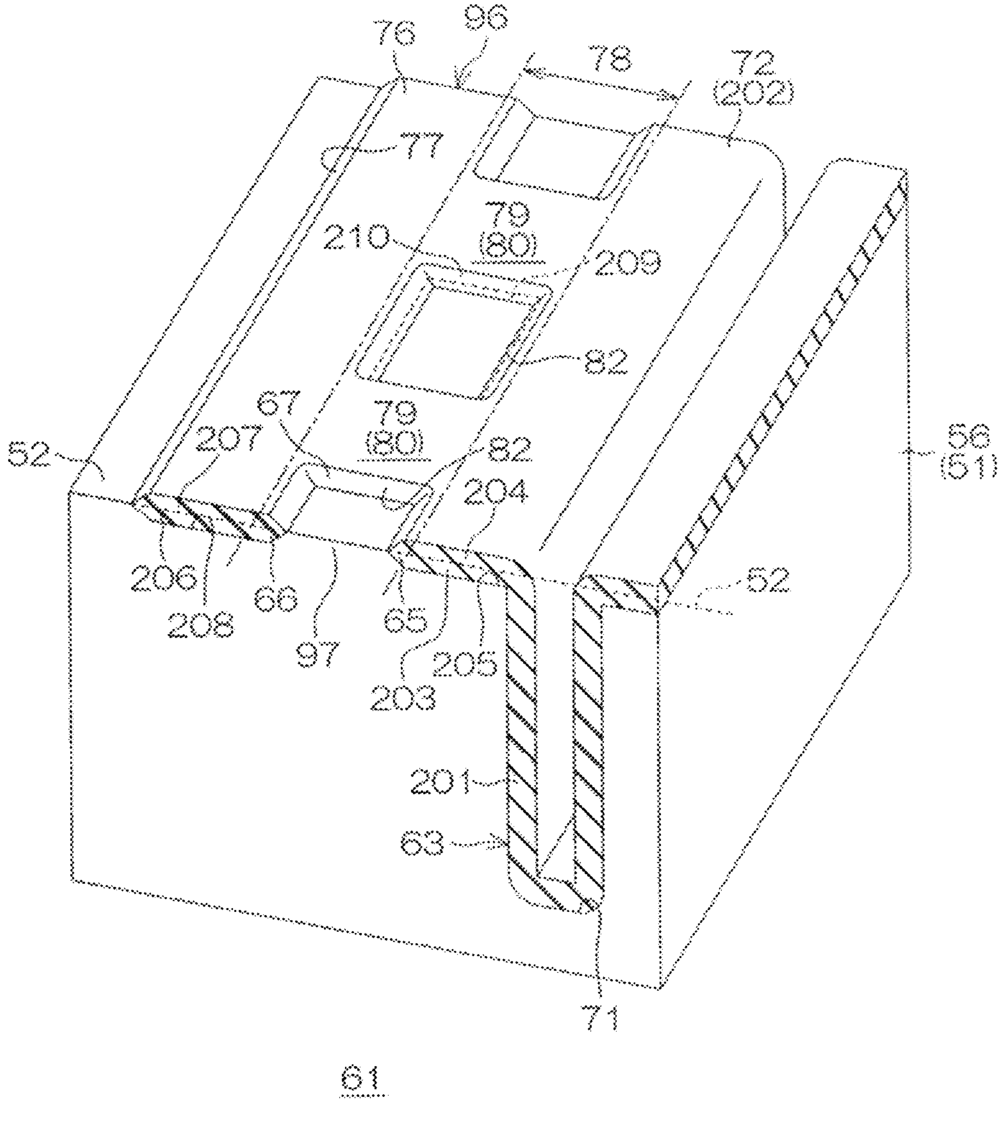
FIG. 7 is a perspective view showing an enlarged portion of an n-type MIS region in FIG. 4.
Figure 8:
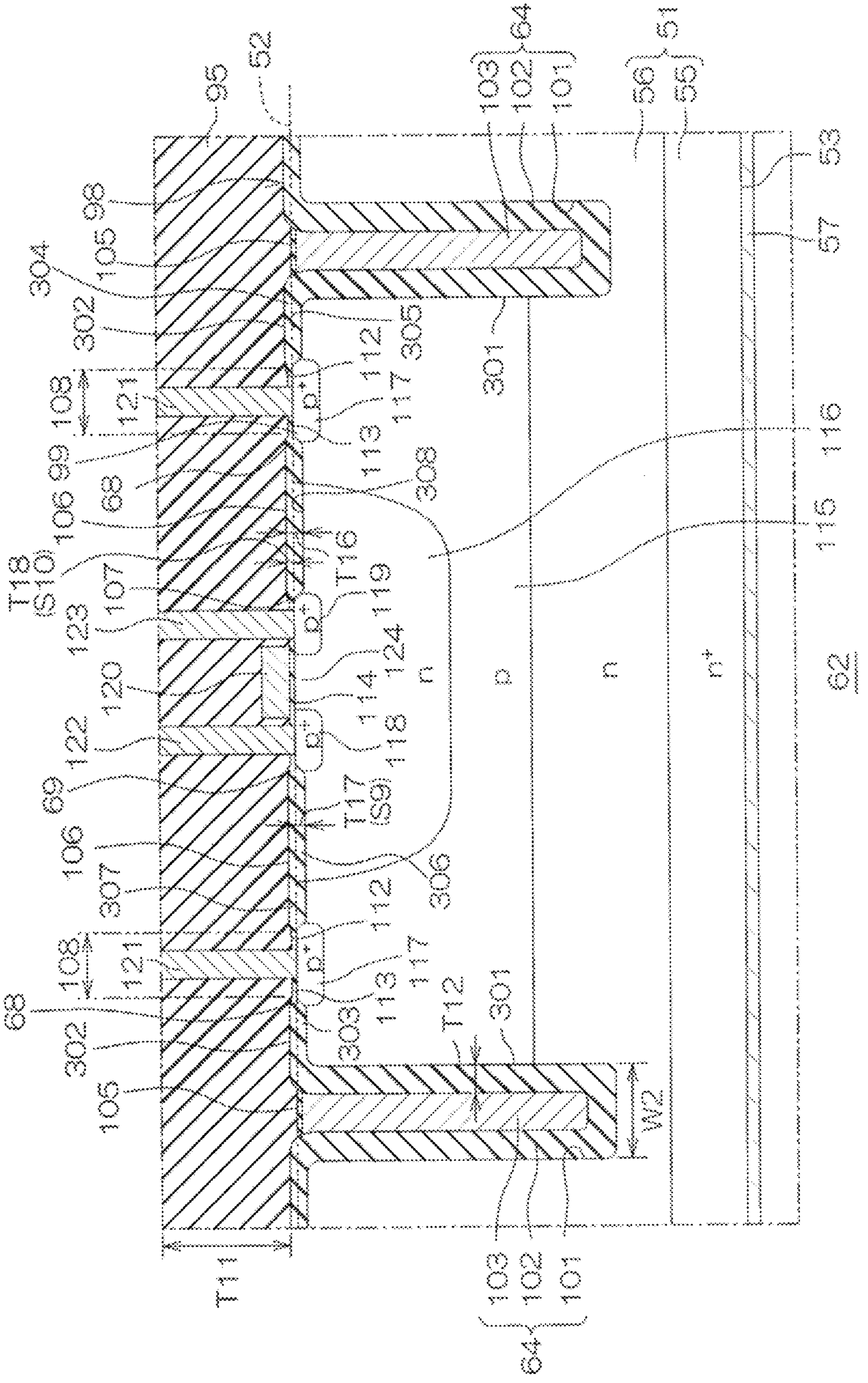
FIG. 8 is a cross-sectional view taken along line VIII-VIII in FIG. 4.
Figure 9:
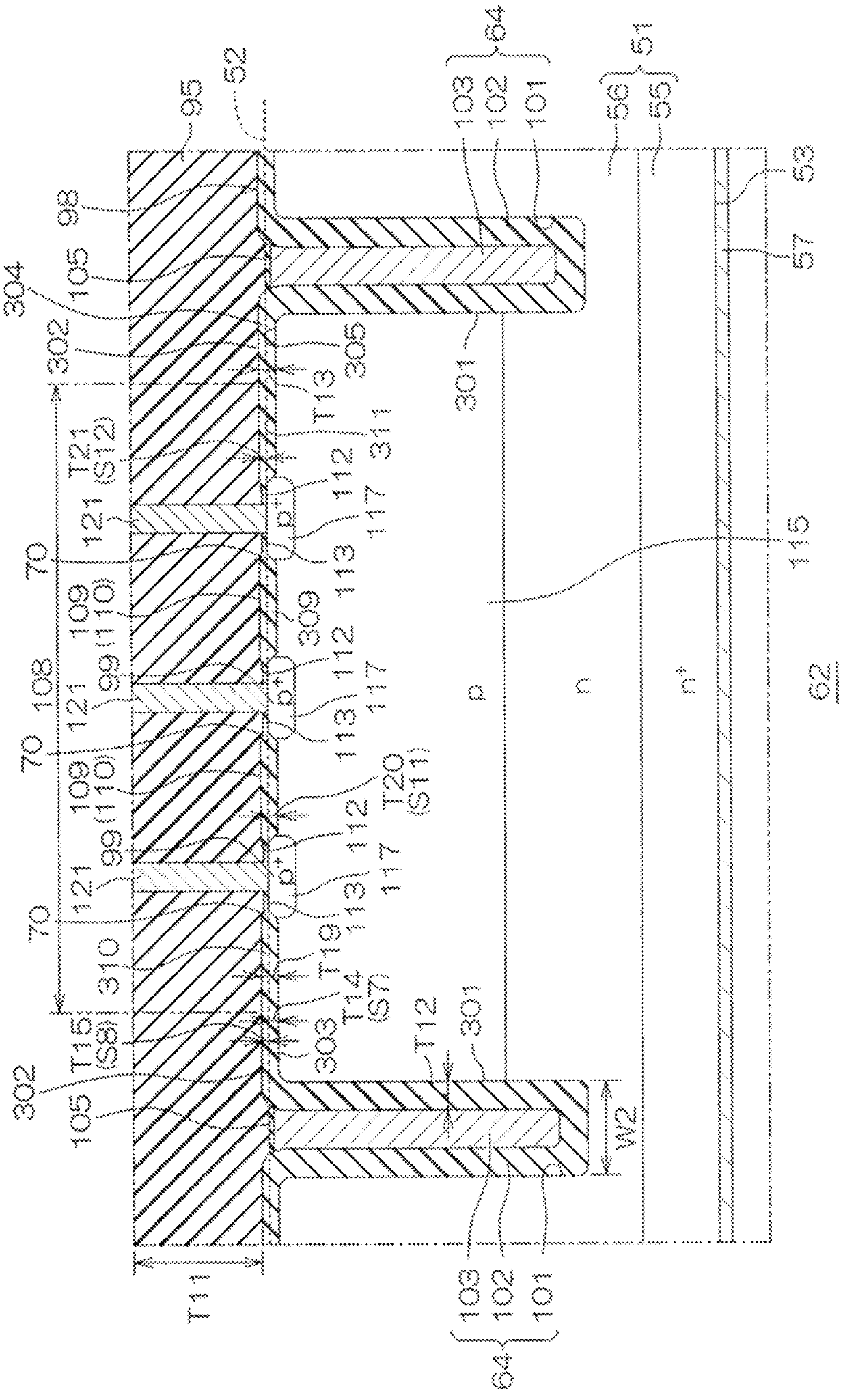
FIG. 9 is a cross-sectional view taken along line IX-IX in FIG. 4.

FIG. 4 is an enlarged view of region IV in FIG. 2. FIG. 5 is a cross-sectional view taken along line V-V in FIG. 4. FIG. 6 is a cross-sectional view taken along line VI-VI in FIG. 4. FIG. 7 is a perspective view showing an enlarged portion of an n-type MIS region 61 in FIG. 4. FIG. 8 is a cross-sectional view taken along line VIII-VIII in FIG. 4. FIG. 9 is a cross-sectional view taken along line IX-IX in FIG. 4. In FIGS. 5 to 9, a height position of a first main surface 52 of a semiconductor layer 51 is indicated by a straight dashed line. FIG. 7 shows only a configuration necessary for explanation among the configurations shown in FIGS. 5 and 6.

Referring to FIGS. 2 and 4 to 9, the IPD chip 2 includes a semiconductor layer 51. The semiconductor layer 51 is formed in a rectangular parallelepiped shape. The semiconductor layer 51 has a first main surface 52 on one side, a second main surface 53 on the other side, and a side surface 54 (see FIG. 2) connecting the first main surface 52 and the second main surface 53. The first main surface 52 and the second main surface 53 are formed in a square shape (more specifically, a rectangular shape) in a plan view seen from the normal direction thereof (hereinafter simply referred to as a "plan view").

Referring to FIGS. 5 to 9, in this embodiment, the semiconductor layer 51 has a stacked structure including a semiconductor substrate 55 and an epitaxial layer 56 formed on the semiconductor substrate 55. The second main surface 53 of the semiconductor layer 51 is formed by the semiconductor substrate 55. The first main surface 52 of the semiconductor layer 51 is formed by the epitaxial layer 56. The side surface 54 (see FIG. 2) of the semiconductor layer 51 is formed by the semiconductor substrate 55 and the epitaxial layer 56.

The semiconductor substrate 55 is an n-type semiconductor substrate. The epitaxial layer 56 is an n-type epitaxial layer having an n-type impurity concentration lower than that of the semiconductor substrate 55. A back surface electrode 57 is formed on the second main surface 53 of the semiconductor layer 51. The back surface electrode 57 is bonded to the die pad 3 via the conductive bonding material 19 (see also FIG. 1).

Referring to FIG. 4, in the input region 13 of the IPD chip 2, the CMIS region 17 as an example of an active region is formed on the first main surface 52 of the semiconductor layer 51. The CMIS region 17 includes an n-type MIS region 61 and a p-type MIS region 62 which are electrically isolated from each other. The CMIS region 17 further includes a first element isolation structure 63 and a second element isolation structure 64. In this embodiment, the first element isolation structure 63 and the second element isolation structure 64 are spaced apart from each other.

The first element isolation structure 63 partitions the n-type MIS region 61 from other regions. The first element isolation structure 63 is formed in an annular shape surrounding the n-type MIS region 61. In this embodiment, the n-type MIS region 61 is formed in a square shape in a plan view. The first element isolation structure 63 is formed in a square annular shape surrounding the n-type MIS region 61 in a plan view.

The second element isolation structure 64 partitions the p-type MIS region 62 from other regions. The second element isolation structure 64 is formed in an annular shape surrounding the p-type MIS region 62. In this embodiment, the p-type MIS region 62 is formed in a square shape in a plan view. The second element isolation structure 64 is formed in a square annular shape surrounding the p-type MIS region 62 in a plan view.

A structure on the n-type MIS region 61 side will be described below with reference to FIGS. 4 to 7, and then a structure on the p-type MIS region 62 side will be described with reference to FIGS. 4, 8, and 9. A perspective view corresponding to the structure on the p-type MIS region 62 side is omitted because it is the same as the structure on the n-type MIS region 61 side in FIG. 7.

Referring to FIGS. 4 to 7, in the n-type MIS region 61, a first trench 71 for partitioning the n-type MIS region 61 is formed in a surface layer portion of the first main surface 52 of the semiconductor layer 51 in the n-type MIS region 61.

The first trench 71 is formed in a square annular shape surrounding the n-type MIS region 61 in a plan view. The depth of the first trench 71 may be 1 μm or more and 10 μm or less (for example, about 4 μm).

A first buried layer 73 (not shown in FIG. 7) is formed inside the first trench 71 via a first trench insulating layer 72. The first element isolation structure 63 has a first trench insulation structure including the first trench 71, the first trench insulating layer 72, and the first buried layer 73. The first element isolation structure 63 is also called a DTI (Deep Trench Isolation) structure or an STI (Shallow Trench Isolation) structure depending on the depth and aspect ratio of the first trench 71.

The first trench insulating layer 72 may contain silicon oxide. The first trench insulating layer 72 is formed in a film shape along an inner wall surface of the first trench 71. As a result, a concave space is partitioned inside the first trench 71 by the first trench insulating layer 72.

Referring to FIGS. 5 to 7, the first trench insulating layer 72 includes a trench inner covering portion 201 and a first field covering portion 202.

The trench inner covering portion 201 is formed inside the first trench 71 and covers the inner wall surface of the first trench 71. The trench inner covering portion 201 has a thickness T1 (see FIGS. 5 and 6) of, for example, 2,000 Å or more and 4,000 Å or less.

The first field covering portion 202 is drawn out from the inside of the first trench 71 onto the first main surface 52 of the semiconductor layer 51. Thus, the first field covering portion 202 covers the n-type MIS region 61 of the semiconductor layer 51. The first field covering portion 202 is a region overlapping the first main surface 52 of the semiconductor layer 51 in the first trench insulating layer 72, so it may be called a first overlapping portion. In FIG. 4, the first field covering portion 202 is indicated by hatching for clarity.

The first field covering portion 202 has a predetermined width from an opening end of the first trench 71 and covers a periphery of the n-type MIS region 61. The first field covering portion 202 is formed in a square annular shape along the inner edge of the first trench 71 in a plan view. The first field covering portion 202 may be formed in an edged strip shape along the inner edge of the first trench 71 in a plan view. The first field covering portion 202 is formed as a portion of the integral field insulating layer 96 covering the first main surface 52 of the semiconductor layer 51. The field insulating layer 96 is a region isolation insulating layer that isolates a plurality of semiconductor regions formed in the n-type MIS region 61 from one another.

Referring to FIG. 6, the first field covering portion 202 has a thickness T2 that is smaller than the thickness T1 of the trench inner covering portion 201. The thickness T2 of the first field covering portion 202 may be, for example, 500 Å or more and 3,000 Å or less. The first field covering portion 202 integrally includes a first buried portion 203 buried in the first main surface 52 of the semiconductor layer 51 and a first protruding portion 204 protruding from the first main surface 52. The thickness T2 of the first field covering portion 202 may be a sum of a thickness T3 of the first buried portion 203 and a thickness T4 of the first protruding portion 204 (T2=T3+T4).

The semiconductor layer 51 is in contact with a bottom of the first buried portion 203 and has a first low step surface 205 having a step difference S1 with respect to the first main surface 52. Therefore, the first field covering portion 202 is buried in the semiconductor layer 51 by a thickness corresponding to the step difference S1 between the first main surface 52 and the first low step surface 205. The thickness T3 (=the step difference S1) of the first buried portion 203 may be, for example, 1,000 Å or more and 1,500 Å or less. On the other hand, the first field covering portion 202 protrudes from the first main surface 52 of the semiconductor layer 51 by a thickness corresponding to a step difference S2 between the first main surface 52 and the upper surface of the first protruding portion 204. The thickness T4 (=the step difference S2) of the first protruding portion 204 may be smaller than the thickness T3 of the first buried portion 203, and may be, for example, −500 Å or more and 1,500 Å or less. That is, a burial amount of the first field covering portion 202 with respect to the first main surface 52 of the semiconductor layer 51 may be larger than a protrusion amount of the first field covering portion 202 with respect to the first main surface 52. A range of "− (minus)" in the above range may mean that the first field covering portion 202 is deeply reduced by etching, the first protruding portion 204 disappears, and the film reduction progresses to the first buried portion 203.

The first buried layer 73 is buried in the concave space partitioned by the first trench insulating layer 72 (the trench inner covering portion 201). The first buried layer 73 may contain polysilicon. A first cap insulating layer 75 is formed on an exposed surface of the first buried layer 73. The first cap insulating layer 75 may contain silicon oxide.

A ratio T1/W1 of the thickness T1 of the first trench insulating layer 72 (the trench inner covering portion 201) to the width W1 of the first trench 71 may be 0.1 or more and less than 0.5. The width W1 of the first trench 71 may be 0.3 μm or more and 2.0 μm or less (for example, 1.6 μm). The thickness T1 of the first trench insulating layer 72 may be 0.1 μm or more and 0.5 μm or less (for example, 0.3 μm).

A first field insulating layer 76 covering the n-type MIS region 61 is formed on the first main surface 52 of the semiconductor layer 51. In FIG. 4, the first field insulating layer 76 is indicated by hatching for clarity. The first field insulating layer 76 is formed by being spaced apart from the inner edge of the first trench 71 toward the inner side of the n-type MIS region 61.

More specifically, the first field insulating layer 76 is formed by being spaced apart from the first field covering portion 202 of the first trench insulating layer 72. A first opening 77 which exposes the first main surface 52 of the semiconductor layer 51 is formed in the inner portion of the first field insulating layer 76. Thus, the first field insulating layer 76 is formed in a square annular shape in a plan view. The first field insulating layer 76 is formed as a portion of the integral field insulating layer 96 covering the first main surface 52 of the semiconductor layer 51.

Referring to FIG. 5, the first field insulating layer 76 has a thickness T5 (T2=T5) substantially equal to the thickness T2 of the first field covering portion 202 of the first trench insulating layer 72. That is, the thickness T5 of the first field insulating layer 76 may be, for example, 1,000 Å or more and 3,000 Å or less. The first field insulating layer 76 integrally includes a first field buried portion 206 buried in the first main surface 52 of the semiconductor layer 51 and a first field protruding portion 207 protruding from the first main surface 52. The thickness T5 of the first field insulating layer 76 may be a sum of a thickness T6 of the first field buried portion 206 and a thickness T7 of the first field protruding portion 207 (T5=T6+T7).

The semiconductor layer 51 is in contact with a bottom of the first field buried portion 206 and has a first field low step surface 208 having a step difference S3 with respect to the first main surface 52. Therefore, the first field insulating layer 76 is buried in the semiconductor layer 51 by a thickness corresponding to the step difference S3 between the first main surface 52 and the first field low step surface 208. The thickness T6 (=the step difference S3) of the first field buried portion 206 may be, for example, 1,000 Å or more and 1,500 Å or less. On the other hand, the first field insulating layer 76 protrudes from the first main surface 52 of the semiconductor layer 51 by a thickness corresponding to a step difference S4 between the first main surface 52 and an upper surface of the first field protruding portion 207. The thickness T7 (=the step difference S4) of the first field protruding portion 207 is smaller than the thickness T6 of the first field buried portion 206, and may be, for example, −500 Å or more and 1,500 Å or less. That is, a burial amount of the first field insulating layer 76 with respect to the first main surface 52 of the semiconductor layer 51 may be larger than a protrusion amount of the first field insulating layer 76 with respect to the first main surface 52. A range of "− (minus)" in the above range may mean that the first field insulating layer 76 is deeply reduced by etching, the first field protruding portion 207 disappears, and the film reduction progresses to the first field buried portion 206.

A first bridge insulating layer 79 is formed in a first intermediate region 78 between the first trench insulating layer 72 and the first field insulating layer 76. In FIG. 4, the first bridge insulating layer 79 is indicated by hatching for clarity. The first intermediate region 78 is a square annular region surrounding the first field insulating layer 76 in a plan view.

Referring to FIG. 7, the first bridge insulating layer 79 is connected to the first trench insulating layer 72 and the first field insulating layer 76. More specifically, the first bridge insulating layer 79 is connected to the first field insulating layer 76 and the first field covering portion 202. The first bridge insulating layer 79 is formed as a portion of the integral field insulating layer 96 covering the first main surface 52 of the semiconductor layer 51. That is, in this embodiment, the first field covering portion 202 of the first trench insulating layer 72, the first field insulating layer 76, and the first bridge insulating layer 79 may be formed by one field insulating layer 96 which extends continuously. The first bridge insulating layer 79, the first trench insulating layer 72, and the first field insulating layer 76 may contain the same insulating material. The first bridge insulating layer 79, the first trench insulating layer 72, and the first field insulating layer 76 may contain silicon oxide.

Referring to FIG. 6, the first bridge insulating layer 79 has a thickness T8 (T2=T8) substantially equal to the thickness T2 of the first field covering portion 202 of the first trench insulating layer 72. That is, the thickness T8 of the first bridge insulating layer 79 may be, for example, 1,000 Å or more and 3,000 Å or less. The first bridge insulating layer 79 integrally includes a first bridge buried portion 209 buried in the first main surface 52 of the semiconductor layer 51 and a first bridge protruding portion 210 protruding to the first main surface 52. The thickness T8 of the first bridge insulating layer 79 may be a sum of a thickness T9 of the first bridge buried portion 209 and a thickness T10 of the first bridge protruding portion 210 (T8=T9+T10).

The semiconductor layer 51 is in contact with a bottom of the first bridge buried portion 209 and has a first bridge low step surface 211 having a step difference S5 with respect to the first main surface 52. Therefore, the first bridge insulating layer 79 is buried in the semiconductor layer 51 by a thickness corresponding to the step difference S5 between the first main surface 52 and the first bridge low step surface 211. The thickness T9 (=the step difference S5) of the first bridge buried portion 209 may be, for example, 1,000 Å or more and 1,500 Å or less. On the other hand, the first bridge insulating layer 79 protrudes from the first main surface 52 of the semiconductor layer 51 by a thickness corresponding to a step difference S6 between the first main surface 52 and the upper surface of the first bridge protruding portion 210. The thickness T10 (=the step difference S6) of the first bridge protruding portion 210 is smaller than the thickness T9 of the first bridge buried portion 209, and may be, for example, −500 Å or more and 1,500 Å or less. That is, a burial amount of the first bridge insulating layer 79 with respect to the first main surface 52 of the semiconductor layer 51 may be larger than a protrusion amount of the first bridge insulating layer 79 with respect to the first main surface 52. A range of "− (minus)" in the above range may mean that the first bridge insulating layer 79 is deeply reduced by etching, the first bridge protruding portion 209 disappears, and the film reduction progresses to the first bridge buried portion 209.

Referring to FIG. 4, in this embodiment, a plurality of first bridge insulating layers 79 is formed in the first intermediate region 78. Each first bridge insulating layer 79 includes a pair of first connecting portions 80 and a pair of second connecting portions 81. The pair of first connecting portions 80 is arranged by being spaced apart from each other in an arbitrary first direction X so as to face each other with the first field insulating layer 76 interposed therebetween. The pair of second connecting portions 81 is arranged by being spaced apart from each other in a second direction Y intersecting the first direction X so as to face each other with the first field insulating layer 76 interposed therebetween. In this embodiment, the first direction X is set as the arrangement direction of the n-type MIS region 61 and the p-type MIS region 62. In this embodiment, the second direction Y is set as a direction orthogonal to the first direction X.

FIG. 4 shows an example in which four pairs of first connecting portions 80 are formed by being spaced apart from each other along the second direction Y and four pairs of second connecting portions 81 are formed by being spaced apart from each other along the first direction X. A first connecting portion 80 and a second connecting portion 81, which are adjacent in a region along the corner of the first trench 71, may be connected to each other. That is, a pair of connecting portions may be arranged by being spaced apart from each other in a diagonal direction of the first trench 71 so as to face each other with the first field insulating layer 76 interposed therebetween.

Expansion/contraction of the first trench insulating layer 72 along the first direction X and expansion/contraction of the first field insulating layer 76 along the first direction X are restricted by the pair of first connecting portions 80. This suppresses occurrence of a stress along the first direction X in the semiconductor layer 51.

Expansion/contraction of the first trench insulating layer 72 along the second direction Y and expansion/contraction of the first field insulating layer 76 along the second direction Y are restricted by the pair of second connecting portions 81. This suppresses occurrence of a stress along the second direction Y in the semiconductor layer 51.

In this way, the first bridge insulating layer 79 keeps the width of the first intermediate region 78 at a predetermined value. As a result, fluctuation in the relative positional relationship between the first trench insulating layer 72 and the first field insulating layer 76 due to thermal expansion or the like of the first field insulating layer 76 and/or the first trench insulating layer 72 is suppressed.

Therefore, stress concentration on the semiconductor layer 51 is suppressed. This suppresses occurrence of crystal defects in the semiconductor layer 51. Therefore, the first bridge insulating layer 79 reinforces the semiconductor layer 51 on the first main surface 52 of the semiconductor layer 51 of the n-type MIS region 61 and forms a crystal defect suppression structure which suppresses crystal defects.

A first contact opening 82, which exposes the first main surface 52 of the semiconductor layer 51, is formed in the first intermediate region 78. In this embodiment, a plurality of first contact openings 82 (12 first contact openings 82 in this embodiment) is formed around the first opening 77 of the first field insulating layer 76.

The first contact opening 82 is partitioned by the first trench insulating layer 72, the first field insulating layer 76, and the first bridge insulating layer 79. In a plan view, the first contact opening 82 may be partitioned in a circular shape as shown in FIG. 4, or may be partitioned in a square shape as shown in FIG. 7. The first contact opening 82 may be partitioned in other polygonal shapes such as a triangular shape and a hexagonal shape in a plan view.

Each of peripheral edge portions of the first trench insulating layer 72, the first field insulating layer 76, and the first bridge insulating layer 79, which partition the first contact opening 82, includes a bird's beak. For example, the bird's beak is a peripheral edge portion of an oxide film, which is formed by the oxide film infiltrated under a peripheral edge portion of a mask when forming the oxide film by thermal oxidation treatment in a state of selectively covering the first main surface 52 of the semiconductor layer 51 with the mask. The bird's beak of the oxide film has a smaller thickness than a base portion of the oxide film formed in a region not covered by the mask.

In this embodiment, a bird's beak 65 is formed on the peripheral edge portion of the first trench insulating layer 72 (the first field covering portion 202), a bird's beak 66 is formed on the peripheral edge portion of the first field insulating layer 76, and a bird's beak 67 is formed on the peripheral edge portion of the first bridge insulating layer 79. As shown in FIG. 7, the bird's beaks 65 to 67 are integrally continuous in an annular shape surrounding the first contact opening 82. Therefore, the first contact opening 82 is formed with the bird's beaks 65 to 67 over the entire circumference. Further, as shown in FIG. 6, the first opening 77 is partitioned by the bird's beak 66 of the first field insulating layer 76.

The surface layer portion of the first main surface 52 of the semiconductor layer 51 exposed from the first contact opening 82 is a first contact portion 97. Referring to FIG. 7, the first contact portion 97 is formed in a mesa shape surrounded by the first bridge buried portion 209, the first buried portion 203, and the first field buried portion 206. That is, in this embodiment, a portion, which is not covered with the field insulating layer 96, selectively protrudes as a portion of the first main surface 52 of the semiconductor layer 51 to form a partial mesa shape. On the other hand, a portion of the semiconductor layer 51, which is covered with the field insulating layer 96, forms a concave surface including the first low step surface 205, the first field low step surface 208, and the first bridge low step surface 211. In a broad sense, the first main surface of the semiconductor layer 51 may also include the entire first main surface 52 on one side in the thickness direction of the semiconductor layer 51. On the other hand, in a narrow sense, the first main surface of the semiconductor layer 51 may also include a portion of the main surface, which is formed at a position higher than the first low step surface 205, the first field low step surface 208, and the first bridge low step surface 211, in the first main surface 52.

Referring to FIGS. 5 and 6, a first contact insulating layer 83 covering the first main surface 52 of the semiconductor layer 51 is formed inside the first contact opening 82. The first contact insulating layer 83 has a thickness equal to or less than the thickness T2 of the first field covering portion 202. A first gate insulating layer 84 covering the first main surface 52 of the semiconductor layer 51 is formed in the first opening 77 of the first field insulating layer 76. The first gate insulating layer 84 has a thickness equal to or less than the thickness T2 of the first field covering portion 202. Further, the first contact insulating layer 83 may be omitted.

A p-type well region 85 is formed in the surface layer portion of the semiconductor layer 51 in a region (the n-type MIS region 61) surrounded by the first trench 71. The p-type well region 85 is formed down to a middle portion of the first trench 71 in the depth direction. A bottom portion of the p-type well region 85 is in contact with a sidewall of the first trench 71.

A $p^+$-type contact region 87 is formed in the surface layer portion of the p-type well region 85. The $p^+$-type contact region 87 has a p-type impurity concentration higher than that of the p-type well region 85. The $p^+$-type contact region 87 is formed in a region overlapping the first contact opening 82 in a plan view. In this embodiment, the $p^+$-type contact region 87 is selectively formed in the first contact portion 97. Referring to FIGS. 5 and 6, the $p^+$-type contact region 87 has a portion which straddles a boundary between the bird's beaks 65 to 67 and the first contact insulating layer 83 and overlaps the bird's beaks 65 to 67.

An $n^+$-type source region 88 and an $n^+$-type drain region 89 are further formed by being spaced apart from each other in the surface layer portion of the p-type well region 85. The $n^+$-type source region 88 and the $n^+$-type drain region 89 are each formed in a region surrounded by the first opening 77 of the first field insulating layer 76 in a plan view. The $n^+$-type source region 88 and the $n^+$-type drain region 89 may each be formed in a strip shape extending in the same direction in a plan view.

A first gate electrode 90, a first contact electrode 91, a first source electrode 92, and a first drain electrode 93 are formed on the first main surface 52 of the semiconductor layer 51.

The first gate electrode 90 is formed on the first gate insulating layer 84. The first gate electrode 90 faces the $n^+$-type source region 88, the $n^+$-type drain region 89, and a p-type channel region 94 with the first gate insulating layer 84 interposed therebetween.

The p-type channel region 94 is formed by a portion interposed between the $n^+$-type source region 88 and the $n^+$-type drain region 89 in the surface layer portion of the p-type well region 85.

An interlayer insulating layer 95 is formed on the first main surface 52 of the semiconductor layer 51. The interlayer insulating layer 95 covers the field insulating layer 96, the first gate electrode 90, the first contact electrode 91, the first source electrode 92, and the first drain electrode 93.

The interlayer insulating layer 95 may have a single-layer structure including a single insulating layer. The interlayer insulating layer 95 may have a stacked structure in which a plurality of insulating layers are stacked. The interlayer insulating layer 95 may contain silicon oxide or silicon nitride.

The interlayer insulating layer 95 may include an insulating layer containing silicon nitride and silicon oxide. The insulating layer containing silicon nitride and silicon oxide may include, for example, a silicon nitride layer, an HDP (High Density Plasma) silicon oxide layer, and a USG (Undoped Silica Glass) layer. More specifically, it may have a structure in which the silicon nitride layer, the HDP silicon oxide layer, and the USG layer are stacked in this order. Further, the interlayer insulating layer 95 may have a single-layer structure of any one of these layers. The USG layer may have a flat planar surface. The planar surface of the USG layer may be a ground surface ground by a chemical mechanical polishing (CMP) method.

A thickness T11 of the interlayer insulating layer 95 may be 6,000 Å or more and 10,000 Å or less. When the interlayer insulating layer 95 includes a stacked structure of the silicon nitride layer, the HDP silicon oxide layer, and the USG layer, a breakdown of a thickness is, for example, 300 Å or more and 600 Å or less for the silicon nitride layer, 3,000 Å or more and 5,000 Å or less for the HDP silicon oxide layer, and 3,000 Å or more and 5,000 Å or less for the USG layer.

The first contact electrode 91 is electrically connected to the $p^+$-type contact region 87 through the interlayer insulating layer 95. The first source electrode 92 is electrically connected to the $n^+$-type source region 88 through the interlayer insulating layer 95. The first drain electrode 93 is electrically connected to the $n^+$-type drain region 89 through the interlayer insulating layer 95.

Referring to FIGS. 4, 8, and 9, a second trench 101 for partitioning the p-type MIS region 62 is formed in the surface layer portion of the first main surface 52 of the semiconductor layer 51 in the p-type MIS region 62.

The second trench 101 is formed in a square annular shape surrounding the p-type MIS region 62 in a plan view. A depth of the second trench 101 may be 1 μm or more and 10 μm or less (for example, about 4 μm).

A second buried layer 103 is formed inside the second trench 101 via a second trench insulating layer 102. The second element isolation structure 64 has a second trench insulation structure including the second trench 101, the second trench insulating layer 102, and the second buried layer 103. The second element isolation structure 64 is also called a DTI (Deep Trench Isolation) structure or an STI (Shallow Trench Isolation) structure depending on the depth and aspect ratio of the second trench 101.

The second trench insulating layer 102 may contain silicon oxide. The second trench insulating layer 102 is formed in a film shape along the inner wall surface of the second trench 101. As a result, a concave space is partitioned inside the second trench 101 by the second trench insulating layer 102.

Referring to FIGS. 8 and 9, the second trench insulating layer 102 includes a trench inner covering portion 301 and a second field covering portion 302.

The trench inner covering portion 301 is formed inside the second trench 101 and covers the inner wall surface of the second trench 101. The trench inner covering portion 301 has a thickness T12 (see FIGS. 8 and 9) of, for example, 2,000 Å or more and 4,000 Å or less.

The second field covering portion 302 is drawn out from the inside of the second trench 101 onto the first main surface 52 of the semiconductor layer 51. Thus, the second field covering portion 302 covers the p-type MIS region 62 of the semiconductor layer 51. The second field covering portion 302 is a region overlapping the first main surface 52 of the semiconductor layer 51 in the second trench insulating layer 102, so it may be called a second overlapping portion. In FIG. 4, the second field covering portion 302 is indicated by hatching for clarity.

The second field covering portion 302 has a predetermined width from an opening end of the second trench 101 and covers the periphery of the p-type MIS region 62. The second field covering portion 302 is formed in a square annular shape along an inner edge of the second trench 101 in a plan view. The second field covering portion 302 may be formed in an edged strip shape along the inner edge of the second trench 101 in a plan view. The second field covering portion 302 is formed as a portion of the integral field insulating layer 98 covering the first main surface 52 of the semiconductor layer 51. The field insulating layer 98 is a region isolation insulating layer which isolates a plurality of semiconductor regions formed in the p-type MIS region 62 from one another.

Referring to FIG. 9, the second field covering portion 302 has a thickness T13 that is smaller than the thickness T12 of the trench inner covering portion 301. The thickness T13 of the second field covering portion 302 may be, for example, 1,000 Å or more and 3,000 Å or less. The second field covering portion 302 integrally includes a second buried portion 303 buried in the first main surface 52 of the semiconductor layer 51 and a second protruding portion 304 protruding from the first main surface 52. The thickness T13 of the second field covering portion 302 may be a sum of a thickness T14 of the second buried portion 303 and a thickness T15 of the second protruding portion 304 (T13=T14+T15).

The semiconductor layer 51 is in contact with a bottom of the second buried portion 303 and has a second low step surface 305 having a step difference S7 with respect to the first main surface 52. Therefore, the second field covering portion 302 is buried in the semiconductor layer 51 by a thickness corresponding to the step difference S7 between the first main surface 52 and the second low step surface 305. The thickness T14 (=the step difference S7) of the second buried portion 303 may be, for example, 1,000 Å or more and 1,500 Å or less. On the other hand, the second field covering portion 302 protrudes from the first main surface 52 of the semiconductor layer 51 by a thickness corresponding to a step difference S8 between the first main surface 52 and the upper surface of the second protruding portion 304. The thickness T15 (=the step difference S8) of the second protruding portion 304 may be smaller than the thickness T14 of the second buried portion 303, and may be, for example, −500 Å or more and 1,500 Å or less. That is, a burial amount of the second field covering portion 302 with respect to the first main surface 52 of the semiconductor layer 51 may be larger than a protrusion amount of the second field covering portion 302 with respect to the first main surface 52. A range of "− (minus)" in the above range may mean that the second field covering portion 302 is deeply reduced by etching, the second protruding portion 304 disappears, and the film reduction progresses to the second buried portion 303.

The second buried layer 103 is buried in a concave space partitioned by the second trench insulating layer 102 (the trench inner covering portion 301). The second buried layer 103 may contain polysilicon. A second cap insulating layer 105 is formed on an exposed surface of the second buried layer 103. The second cap insulating layer 105 may contain silicon oxide.

A ratio T12/W2 of the thickness T12 of the second trench insulating layer 102 (the trench inner covering portion 301) to the width W2 of the second trench 101 may be 0.1 or more and less than 0.5. The width W2 of the second trench 101 may be 0.3 μm or more and 2.0 μm or less (for example, 1.6 μm). The thickness T12 of the second trench insulating layer 102 may be 0.1 μm or more and 0.5 μm or less (for example, 0.3 μm). The width W2 of the second trench 101 may be substantially equal to the width W1 of the first trench 71 (W2=W1). The thickness T12 of the second trench insulating layer 102 may be substantially equal to the thickness T1 of the first trench insulating layer 72 (T12=T1).

A second field insulating layer 106 covering the p-type MIS region 62 is formed on the first main surface 52 of the semiconductor layer 51. In FIG. 4, the second field insulating layer 106 is indicated by hatching for clarity. The second field insulating layer 106 is formed by being spaced apart from the inner edge of the second trench 101 toward the inner side of the p-type MIS region 62.

More specifically, the second field insulating layer 106 is formed by being spaced apart from the second field covering portion 302 of the second trench insulating layer 102. A second opening 107 which exposes the first main surface 52 of the semiconductor layer 51 is formed in the inner portion of the second field insulating layer 106. Thus, the second field insulating layer 106 is formed in a square annular shape in a plan view. The second field insulating layer 106 is formed as a portion of the integral field insulating layer 98 covering the first main surface 52 of the semiconductor layer 51.

Referring to FIG. 8, the second field insulating layer 106 has a thickness T16 (T13=T16) substantially equal to the thickness T13 of the second field covering portion 302 of the second trench insulating layer 102. That is, the thickness T16 of the second field insulating layer 106 may be, for example, 1,000 Å or more and 3,000 Å or less. The second field insulating layer 106 integrally includes a second field buried portion 306 buried in the first main surface 52 of the semiconductor layer 51 and a second field protruding portion 307 protruding from the first main surface 52. The thickness T16 of the second field insulating layer 106 may be a sum of a thickness T17 of the second field buried portion 306 and a thickness T18 of the second field protruding portion 307 (T16=T17+T18).

The semiconductor layer 51 is in contact with a bottom of the second field buried portion 306 and has a second field low step surface 308 having a step difference S9 with respect to the first main surface 52. Therefore, the second field insulating layer 106 is buried in the semiconductor layer 51 by a thickness corresponding to the step difference S9 between the first main surface 52 and the second field low step surface 308. The thickness T17 (=the step difference S9) of the second field buried portion 306 may be, for example, 1,000 Å or more and 1,500 Å or less. On the other hand, the second field insulating layer 106 protrudes from the first main surface 52 of the semiconductor layer 51 by a thickness corresponding to a step difference S10 between the first main surface 52 and the upper surface of the second field protruding portion 307. The thickness T18 (=the step difference S10) of the second field protruding portion 307 may be smaller than the thickness T17 of the second field buried portion 306, and may be, for example, −500 Å or more and 1,500 Å or less. That is, a burial amount of the second field insulating layer 106 with respect to the first main surface 52 of the semiconductor layer 51 may be larger than a protrusion amount of the second field insulating layer 106 with respect to the first main surface 52. A range of "− (minus)" in the above range may mean that the second field insulating layer 106 is deeply reduced by etching, the second field protruding portion 307 disappears, and the film reduction progresses to the second field buried portion 306.

A second bridge insulating layer 109 is formed in a second intermediate region 108 between the second trench insulating layer 102 and the second field insulating layer 106. In FIG. 4, the second bridge insulating layer 109 is indicated by hatching for clarity. The second intermediate region 108 is a square annular region surrounding the second field insulating layer 106 in a plan view.

The second bridge insulating layer 109 is connected to the second trench insulating layer 102 and the second field insulating layer 106. More specifically, the second bridge insulating layer 109 is connected to the second field insulating layer 106 and the second field covering portion 302. The second bridge insulating layer 109 is formed as a portion of the integral field insulating layer 98 covering the first main surface 52 of the semiconductor layer 51. That is, in this embodiment, the second field covering portion 302 of the second trench insulating layer 102, the second field insulating layer 106, and the second bridge insulating layer 109 may be formed by one field insulating layer 98 which extends continuously. The second bridge insulating layer 109, the second trench insulating layer 102, and the second field insulating layer 106 may contain the same insulating material. The second bridge insulating layer 109, the second trench insulating layer 102, and the second field insulating layer 106 may contain silicon oxide.

Referring to FIG. 9, the second bridge insulating layer 109 has a thickness T19 (T13=T19) substantially equal to the thickness T13 of the second field covering portion 302 of the second trench insulating layer 102. That is, the thickness T19 of the second bridge insulating layer 109 may be, for example, 1,000 Å or more and 3,000 Å or less. The second bridge insulating layer 109 integrally includes a second bridge buried portion 309 buried in the first main surface 52 of the semiconductor layer 51 and a second bridge protruding portion 310 protruding to the first main surface 52. The thickness T19 of the second bridge insulating layer 109 may be a sum of a thickness T20 of the second bridge buried portion 309 and a thickness T21 of the second bridge protruding portion 310 (T19=T20+T21).

The semiconductor layer 51 is in contact with a bottom of the second bridge buried portion 309 and has a second bridge low step surface 311 having a step difference S11 with respect to the first main surface 52. Therefore, the second bridge insulating layer 109 is buried in the semiconductor layer 51 by a thickness corresponding to the step difference S11 between the first main surface 52 and the second bridge low step surface 311. The thickness T20 (=the step difference S11) of the second bridge buried portion 309 may be, for example, 1,000 Å or more and 1,500 Å or less. On the other hand, the second bridge insulating layer 109 protrudes from the first main surface 52 of the semiconductor layer 51 by a thickness corresponding to a step difference S12 between the first main surface 52 and the upper surface of the second bridge protruding portion 310. The thickness T21 (=the step difference S12) of the second bridge protruding portion 310 may be smaller than the thickness T20 of the second bridge buried portion 309, and may be, for example, −500 Å or more and 1,500 Å or less. That is, a burial amount of the second bridge insulating layer 109 with respect to the first main surface 52 of the semiconductor layer 51 may be larger than a protrusion amount of the second bridge insulating layer 109 with respect to the first main surface 52. A range of "− (minus)" in the above range may mean that the second bridge insulating layer 109 is deeply reduced by etching, the second bridge protruding portion 310 disappears, and the film reduction progresses to the second bridge buried portion 309.

Referring to FIG. 4, in this embodiment, a plurality of second bridge insulating layers 109 is formed in the second intermediate region 108. The second bridge insulating layer 109 includes a pair of first connecting portions 110 and a pair of second connecting portions 111. The pair of first connecting portions 110 is arranged by being spaced apart from each other in the first direction X so as to face each other with the second field insulating layer 106 interposed therebetween. The pair of second connecting portions 111 is arranged by being spaced apart from each other in the second direction Y so as to face each other with the second field insulating layer 106 interposed therebetween.

FIG. 4 shows an example in which four pairs of first connecting portions 110 are formed by being spaced apart from each other along the second direction Y and four pairs of second connecting portions 111 are formed by being spaced apart from each other along the first direction X. A first connecting portion 110 and a second connecting portion 111, which are adjacent in a corner region of the second trench 101, may be connected to each other. That is, a pair of connecting portions may be arranged by being spaced apart from each other in a diagonal direction of the second trench 101 so as to face each other with the second field insulating layer 106 interposed therebetween.

Expansion/contraction of the second trench insulating layer 102 along the first direction X and expansion/contraction of the second field insulating layer 106 along the first direction X are restricted by the pair of first connecting portions 110. This suppresses an occurrence of a stress along the first direction X in the semiconductor layer 51.

Expansion/contraction of the second trench insulating layer 102 along the second direction Y and expansion/contraction of the second field insulating layer 106 along the second direction Y are restricted by the pair of second connecting portions 111. This suppresses an occurrence of a stress along the second direction Y in the semiconductor layer 51.

In this way, the second bridge insulating layer 109 keeps the width of the second intermediate region 108 at a predetermined value. As a result, fluctuation in the relative positional relationship between the second trench insulating layer 102 and the second field insulating layer 106 due to thermal expansion or the like of the second field insulating layer 106 and/or the second trench insulating layer 102 is suppressed.

Therefore, stress concentration on the semiconductor layer 51 is suppressed. This suppresses occurrence of crystal defects in the semiconductor layer 51. Therefore, the second bridge insulating layer 109 reinforces the semiconductor layer 51 on the first main surface 52 of the semiconductor layer 51 of the p-type MIS region 62 to form a crystal defect suppression structure which suppresses crystal defects.

A second contact opening 112 which exposes the first main surface 52 of the semiconductor layer 51 is formed in the second intermediate region 108. In this embodiment, a plurality of second contact openings 112 (twelve second contact openings 112 in this embodiment) is formed around the second opening 107 of the second field insulating layer 106.

The second contact opening 112 is partitioned by the second trench insulating layer 102, the second field insulating layer 106, and the second bridge insulating layer 109. In a plan view, the second contact opening 112 may be partitioned in a circular shape as shown in FIG. 4, or may be partitioned in a square shape. The second contact opening 112 may be partitioned in other polygonal shapes such as a triangular shape and a hexagonal shape in a plan view.

Each of peripheral edge portions of the second trench insulating layer 102, the second field insulating layer 106, and the second bridge insulating layer 109, which partition the second contact opening 112, includes a bird's beak. For example, the bird's beak is a peripheral edge portion of an oxide film, which is formed by the oxide film infiltrated under a peripheral edge portion of a mask when forming the oxide film by thermal oxidation treatment in a state of selectively covering the first main surface 52 of the semiconductor layer 51 with the mask. The bird's beak of the oxide film has a smaller thickness than a base portion of the oxide film formed in a region not covered by the mask.

In this embodiment, a bird's beak 68 is formed on the peripheral edge portion of the second trench insulating layer 102 (the second field covering portion 302), a bird's beak 69 is formed on the peripheral edge portion of the second field insulating layer 106, and a bird's beak 70 is formed on the peripheral edge portion of the second bridge insulating layer 109. The bird's beaks 68 to 70 are integrally continuous in an annular shape surrounding the second contact opening 112. Therefore, the second contact opening 112 is formed with the bird's beaks 68 to 70 over the entire circumference. Further, as shown in FIG. 8, the second opening 107 is partitioned by the bird's beak 69 of the second field insulating layer 106.

The surface layer portion of the first main surface 52 of the semiconductor layer 51 exposed from the second contact opening 112 is a second contact portion 99. Referring to FIG. 7, the second contact portion 99 is formed in a mesa shape surrounded by the second bridge buried portion 309, the second buried portion 303, and the second field buried portion 306. That is, in this embodiment, a portion, which is not covered with the field insulating layer 98, selectively protrudes as a portion of the first main surface 52 of the semiconductor layer 51 to form a partial mesa shape. On the other hand, a portion of the semiconductor layer 51, which is covered with the field insulating layer 98, forms a concave surface including the second low step surface 305, the second field low step surface 308, and the second bridge low step surface 311. In a broad sense, the first main surface of the semiconductor layer 51 may also include the entire first main surface 52 on one side in the thickness direction of the semiconductor layer 51. On the other hand, in a narrow sense, the first main surface of the semiconductor layer 51 may also include a portion of the main surface, which is formed at a position higher than the second low step surface 305, the second field low step surface 308, and the second bridge low step surface 311, in the first main surface 52.

A second contact insulating layer 113 covering the first main surface 52 of the semiconductor layer 51 is formed inside the second contact opening 112. The second contact insulating layer 113 has a thickness equal to or less than the thickness T13 of the second field covering portion 302. Further, the second contact insulating layer 113 may be omitted. A second gate insulating layer 114 covering the first main surface 52 of the semiconductor layer 51 is formed in the second opening 107 of the second field insulating layer 106. The second gate insulating layer 114 has a thickness equal to or less than the thickness T13 of the second field covering portion 302.

A p-type well region 115 is formed in the surface layer portion of the semiconductor layer 51 in a region (the p-type MIS region 62) surrounded by the second trench 101. The p-type well region 115 is formed down to a middle portion of the trench 101 in the depth direction. The bottom portion of the p-type well region 115 is in contact with a sidewall of the trench 101.

An n-type well region 116 is formed on a surface layer portion of the p-type well region 115. The n-type well region 116 is formed down to a middle portion of the p-type well region 115 in the depth direction.

A bottom of the n-type well region 116 is located in a region between the first main surface 52 of the semiconductor layer 51 and the bottom of the p-type well region 115. A periphery of the n-type well region 116 surrounds the second opening 107 of the second field insulating layer 106 in a plan view.

A $p^+$-type contact region 117 is formed in the surface layer portion of the p-type well region 115. The $p^+$-type contact region 117 has a p-type impurity concentration higher than that of the p-type well region 115. The $p^+$-type contact region 117 is formed in a region overlapping the second contact opening 112 in a plan view. In this embodiment, the $p^+$-type contact region 117 is selectively formed in the second contact portion 99. Referring to FIGS. 8 and 9, the $p^+$-type contact region 117 has a portion which straddles a boundary between the bird's beaks 68 to 70 and the second contact insulating layer 113 and overlaps the bird's beaks 68 to 70. The $p^+$-type contact region 117 is formed to be spaced apart from the n-type well region 116.

A $p^+$-type source region 118 and a $p^+$-type drain region 119 are further formed by being spaced apart from each other in the surface layer portion of the n-type well region 116. The $p^+$-type source region 118 and the $p^+$-type drain region 119 are each formed in a region surrounded by the second opening 107 of the second field insulating layer 106 in a plan view. The $p^+$-type source region 118 and the $p^+$-type drain region 119 may each be formed in a strip shape extending along the same direction in a plan view.

A second gate electrode 120, a second contact electrode 121, a second source electrode 122, and a second drain electrode 123 are formed on the first main surface 52 of the semiconductor layer 51.

The second gate electrode 120 is formed on the second gate insulating layer 114. The second gate electrode 120 faces the $p^+$-type source region 118, the $p^+$-type drain region 119, and an n-type channel region 124 with the second gate insulating layer 114 interposed therebetween.

The n-type channel region 124 is formed by a portion interposed between the $p^+$-type source region 118 and the $p^+$-type drain region 119 in the surface layer portion of the n-type well region 116.

The interlayer insulating layer 95 is formed on the first main surface 52 of the semiconductor layer 51. The interlayer insulating layer 95 covers the field insulating layer 98, the second gate electrode 120, the second contact electrode 121, the second source electrode 122, and the second drain electrode 123.

The second contact electrode 121 is electrically connected to the $p^+$-type contact region 117 through the interlayer insulating layer 95. The second source electrode 122 is electrically connected to the $p^+$-type source region 118 through the interlayer insulating layer 95. The second drain electrode 123 is electrically connected to the $p^+$-type drain region 119 through the interlayer insulating layer 95.

Figure 10:
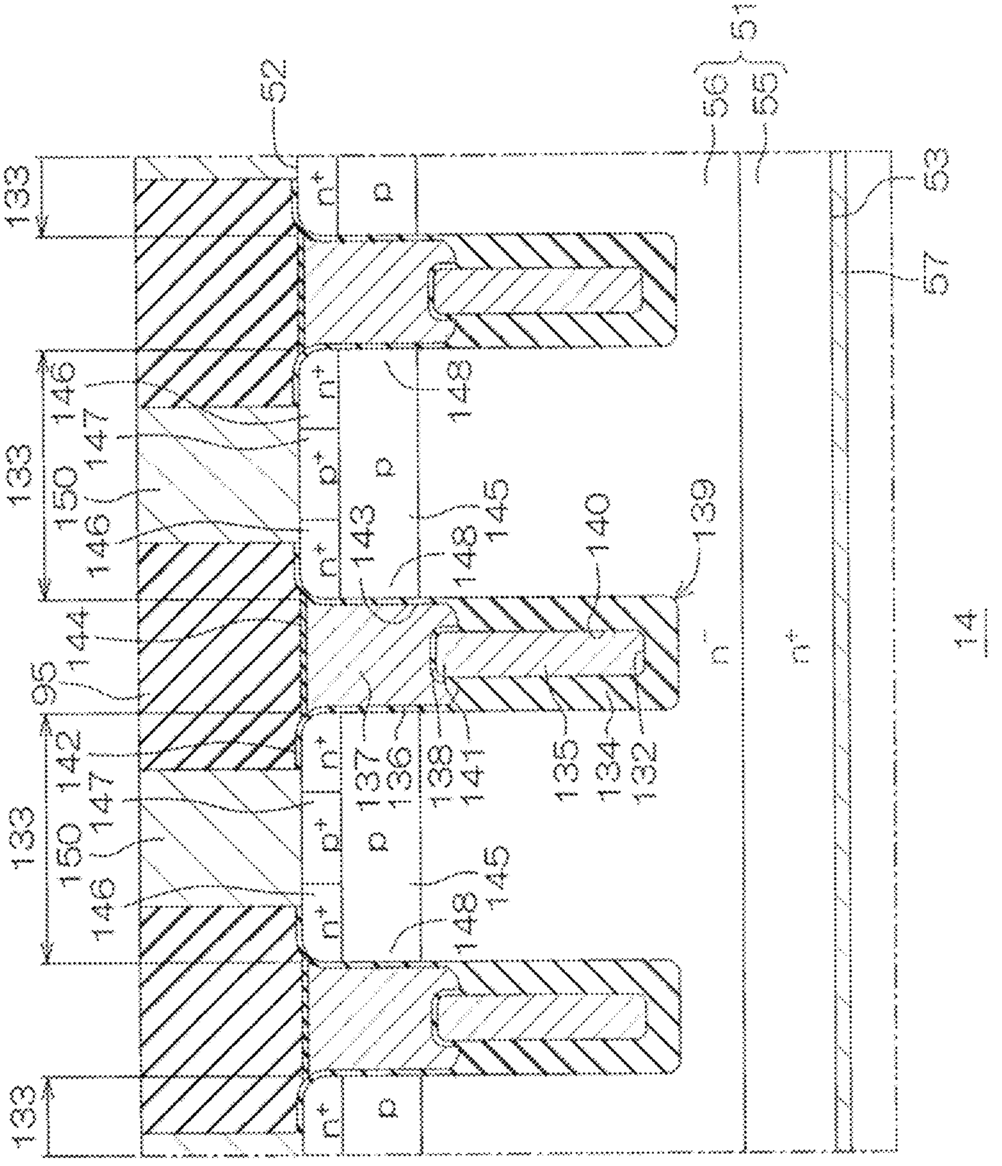
FIG. 10 is a cross-sectional view taken along line X-X in FIG. 2.

FIG. 10 is a cross-sectional view taken along line X-X shown in FIG. 2.

Referring to FIG. 10, the output power MISFET 18 is formed on the semiconductor layer 51 in the output region 14 of the IPD chip 2.

A gate trench 132 is formed in the surface layer portion of the first main surface 52 of the semiconductor layer 51. The gate trench 132 partitions a unit cell 133 of a MIS structure.

The gate trench 132 is formed in a strip shape or a lattice shape in a plan view. The depth of the gate trench 132 may be 1 μm or more and 10 μm or less (about 4 μm in this embodiment).

A lower gate insulating layer 134, a lower gate electrode layer 135, an upper gate insulating layer 136, an upper gate electrode layer 137, and an intermediate insulating layer 138 are formed in the gate trench 132.

This forms a split gate structure 139 including the gate trench 132. The split gate structure 139 has a structure in which two electrodes are vertically separated by an insulator in the gate trench 132.

The lower gate electrode layer 135 is buried in the bottom side of the gate trench 132 with the lower gate insulating layer 134 interposed therebetween. The upper gate electrode layer 137 is buried in the opening side of the gate trench 132 with the upper gate insulating layer 136 interposed therebetween. The upper gate electrode layer 137 is formed on the lower gate electrode layer 135 within the gate trench 132.

The intermediate insulating layer 138 is formed in a region between the lower gate electrode layer 135 and the upper gate electrode layer 137. The lower gate electrode layer 135 and the upper gate electrode layer 137 are insulated from each other by the intermediate insulating layer 138. The split gate structure 139 will be specifically described below.

The lower gate insulating layer 134 is formed in a film shape along the inner wall of the gate trench 132 at the bottom of the gate trench 132. The lower gate insulating layer 134 partitions a lower concave portion 140 at the bottom of the gate trench 132.

The lower gate electrode layer 135 is buried in the lower concave portion 140. The lower gate electrode layer 135 is formed in a wall shape extending along the sidewall of the gate trench 132. The lower gate electrode layer 135 has a convex portion 141.

The convex portion 141 protrudes upward (toward the first main surface 52 of the semiconductor layer 51) from the upper end of the lower gate insulating layer 134. The intermediate insulating layer 138 covers the convex portion 141 of the lower gate electrode layer 135.

The upper gate insulating layer 136 is formed in a film shape along the inner wall of the gate trench 132 on the opening side of the gate trench 132. The upper end of the upper gate insulating layer 136 is formed integrally with a surface insulating layer 142 formed on the first main surface 52 of the semiconductor layer 51. The lower end of the upper gate insulating layer 136 is formed integrally with the upper end of the lower gate insulating layer 134.

A groove, which is partitioned by the intermediate insulating layer 138, the lower gate insulating layer 134, and the upper gate insulating layer 136, is formed on both sides of the convex portion 141 of the lower gate electrode layer 135. As a result, an upper concave portion 143 having an inverted concave shape in a cross-sectional view is partitioned on the opening side of the gate trench 132.

The upper gate electrode layer 137 is buried in the upper concave portion 143. An exposed surface of the upper gate electrode layer 137 may be located below the first main surface 52 of the semiconductor layer 51.

The exposed surface of the upper gate electrode layer 137 may have a concave curved surface toward the bottom wall of the gate trench 132. The exposed surface of the upper gate electrode layer 137 may have a flat surface substantially parallel to the first main surface 52 of the semiconductor layer 51.

The lower gate electrode layer 135 and the upper gate electrode layer 137 may each contain polysilicon. In one embodiment, a gate voltage may be applied to the lower gate electrode layer 135 and the upper gate electrode layer 137. With this structure, the on-resistance of the semiconductor layer 51 can be reduced.

In another embodiment, a gate voltage may be applied to the upper gate electrode layer 137 while a reference voltage (for example, a source voltage) may be applied to the lower gate electrode layer 135.

That is, the lower gate electrode layer 135 may be formed as a field plate electrode. With this structure, a parasitic capacitance between the semiconductor layer 51 and the lower gate electrode layer 135 can be reduced.

The lower gate insulating layer 134, the upper gate insulating layer 136, the intermediate insulating layer 138, and the surface insulating layer 142 may contain the same insulating material. The lower gate insulating layer 134, the upper gate insulating layer 136, the intermediate insulating layer 138, and the surface insulating layer 142 may contain different insulating materials.

The lower gate insulating layer 134, the upper gate insulating layer 136, the intermediate insulating layer 138, and the surface insulating layer 142 may contain at least one insulating material selected from the group of $SiO_2$, AlO, TaO, TiO, AlN, AlSiN, TiN, SiN, NiO, WO, BN, CrN, and SiON. As typical insulating materials of the lower gate insulating layer 134, the upper gate insulating layer 136, the intermediate insulating layer 138, and the surface insulating layer 142, there may be, for example, $SiO_2$ and SiN.

A third cap insulating layer 144 is formed on the exposed surface of the upper gate electrode layer 137. The third cap insulating layer 144 may contain silicon oxide.

The thickness of the lower gate insulating layer 134 may be equal to or greater than the thickness of the upper gate insulating layer 136. The thickness of the intermediate insulating layer 138 may be equal to or less than the thickness of the lower gate insulating layer 134. The thickness of the intermediate insulating layer 138 may be equal to or greater than the thickness of the upper gate insulating layer 136. The thickness of the intermediate insulating layer 138 may be equal to or less than the thickness of the upper gate insulating layer 136.

A ratio (thickness/width) of the thickness of the lower gate insulating layer 134 to the width of the gate trench 132 may be 0.1 or more and less than 0.5. A ratio (thickness/width) of the thickness of the upper gate insulating layer 136 to the width of the gate trench 132 may be 0.01 or more and 0.05 or less. The width of the gate trench 132 may be 0.3 μm or more and 2.0 μm or less (for example, 1.6 μm). The thickness of the lower gate insulating layer 134 may be 0.1 μm or more and 0.5 μm or less (for example, 0.3 μm). The thickness of the upper gate insulating layer 136 may be 0.01 μm or more and 0.05 μm or less (for example, 0.03 μm).

The unit cell 133 includes a p-type body region 145, an $n^+$-type source region 146, and a $p^+$-type contact region 147.

The p-type body region 145 is formed in the surface layer portion of the first main surface 52 of the semiconductor layer 51. The p-type body region 145 is formed down to a middle portion of the gate trench 132 in the depth direction.

The bottom of the p-type body region 145 is in contact with the sidewall of the gate trench 132. The p-type body region 145 is shared by a plurality of gate trenches 132 which is adjacent to one another.

The $n^+$-type source region 146 is formed in the surface layer portion of the p-type body region 145. The $n^+$-type source region 146 is formed along the sidewall of the gate trench 132. The $n^+$-type source region 146 faces the upper gate electrode layer 137 with the upper gate insulating layer 136 interposed therebetween.

The $p^+$-type contact region 147 is formed in the surface layer portion of the p-type body region 145. The $p^+$-type contact region 147 may be electrically connected to the p-type body region 145 through the $n^+$-type source region 146. Further, the $n^+$-type source region 146 and the $p^+$-type contact region 147 may be selectively formed in the p-type body region 145 by a lithography technique and an ion implantation technique, respectively.

The $p^+$-type contact region 147 is formed by being spaced apart from the sidewall of the gate trench 132. The $p^+$-type contact region 147 may have a portion in contact with the sidewall of the gate trench 132.

The upper gate electrode layer 137 faces the $n^+$-type source region 146, a p-type channel region 148, and the epitaxial layer 56 with the upper gate insulating layer 136 interposed therebetween. The p-type channel region 148 is formed in the p-type body region 145 by a region between the $n_+$-type source region 146 and the epitaxial layer 56.

A source pad electrode 150 is formed on the first main surface 52 of the semiconductor layer 51. The source pad electrode 150 is electrically connected to the $n^+$-type source region 146 and the $p^+$-type contact region 147.

The interlayer insulating layer 95 is formed on the first main surface 52 of the semiconductor layer 51. The interlayer insulating layer 95 covers the split gate structure 139 and the source pad electrode 150.

Figure 11:
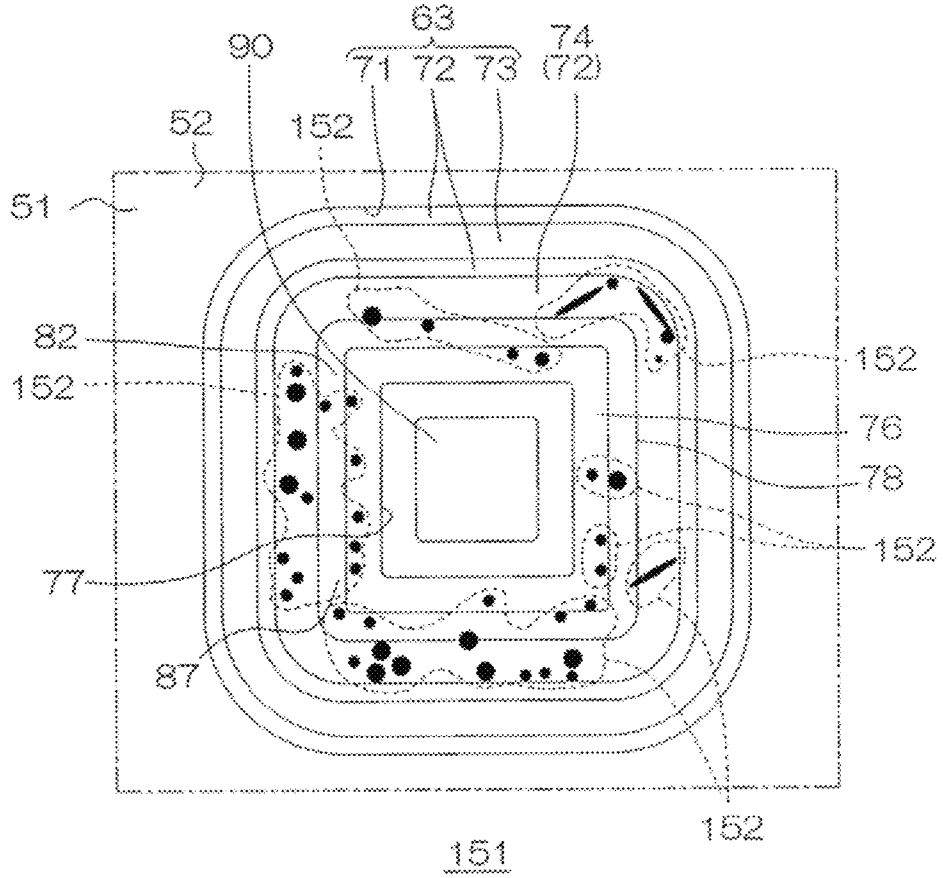
FIG. 11 is a plan view showing a semiconductor device according to a reference example for explaining a mechanism in which crystal defects occur.

FIG. 11 is a plan view showing a semiconductor device 151 according to a reference example for explaining a mechanism in which crystal defects occur. FIG. 11 is also an image of a portion corresponding to the n-type MIS region 61 of the semiconductor device 1.

In FIG. 11, structures similar to those described for the semiconductor device 1 are denoted by the same reference numerals, and explanation thereof will be omitted. In addition, in the semiconductor device 151 according to the reference example, a structure on the p-type MIS region 62 side is the same as a structure on the n-type MIS region 61 side, so explanation thereof will be omitted.

The first bridge insulating layer 79 is not formed in the semiconductor device 151 according to the reference example. The first field insulating layer 76 is formed in an island shape. The first trench insulating layer 72 and the first field insulating layer 76 exist independently from each other.

The first contact opening 82 is formed in the entire first intermediate region 78 between the first trench insulating layer 72 and the first field insulating layer 76. The first contact opening 82 is formed in a square annular shape surrounding the first field insulating layer 76 in a plan view.

The $p^+$-type contact region 87 is formed in a square annular shape along the first contact opening 82 in a plan view. Further, the first contact electrode 91 is formed in a square annular shape along the first contact opening 82 in a plan view.

With such a structure, a contact area of the first contact electrode 91 with respect to the $p^+$-type contact region 87 can be increased. This can achieve potential stabilization.

However, the effects of expansion/contraction due to thermal expansion of the first trench insulating layer 72, the first buried layer 73 and/or the first field insulating layer 76 are imparted to the semiconductor layer 51 independently.

As a result, a stress is generated in the semiconductor layer 51 because the relative positional relationship of the first trench insulating layer 72, the first buried layer 73 and/or the first field insulating layer 76 changes.

The stress generated in the semiconductor layer 51 causes crystal defects 152 in the semiconductor layer 51 (see a region surrounded by a dashed line). Such crystal defects 152 degrade quality of the semiconductor device 151.

On the other hand, in the semiconductor device 1, the first bridge insulating layer 79 is formed in the first intermediate region 78 between the first trench insulating layer 72 and the first field insulating layer 76. Thereby, the width of the first intermediate region 78 can be maintained at a predetermined value by the first bridge insulating layer 79. As a result, it is possible to suppress the relative positional relationship between the first trench insulating layer 72 and the first field insulating layer 76 from fluctuating due to expansion/contraction caused by thermal expansion of the first field insulating layer 76 and/or the first trench insulating layer 72. Therefore, it is possible to suppress a stress on the semiconductor layer 51.

In particular, in this embodiment, the plurality of first bridge insulating layers 79 is formed in the first intermediate region 78. The plurality of first bridge insulating layers 79 includes the pair of first connecting portions 80 and the pair of second connecting portions 81. The pair of first connecting portions 80 is arranged by being spaced apart from each other in the first direction X so as to face each other with the first field insulating layer 76 interposed therebetween. The pair of second connecting portions 81 is arranged by being spaced apart from each other in the second direction Y so as to face each other with the first field insulating layer 76 interposed therebetween. Accordingly, expansion/contraction of the first trench insulating layer 72 along the first direction X and expansion/contraction of the first field insulating layer 76 along the first direction X can be restricted by the pair of first connecting portions 80. As a result, it is possible to suppress a stress along the first direction X in the semiconductor layer 51.

Further, expansion/contraction of the first trench insulating layer 72 along the second direction Y and expansion/contraction of the first field insulating layer 76 along the second direction Y can be restricted by the pair of second connecting portions 81. As a result, it is possible to suppress a stress along the second direction Y in the semiconductor layer 51. Therefore, it is possible to provide the semiconductor device 1 capable of appropriately suppressing the occurrence of the crystal defects 152 in the semiconductor layer 51.

Next, a manufacturing flow of the semiconductor device 1 will be described by dividing it into a first embodiment and a second embodiment.

[First Embodiment of Manufacturing Flow]

Figure 12:
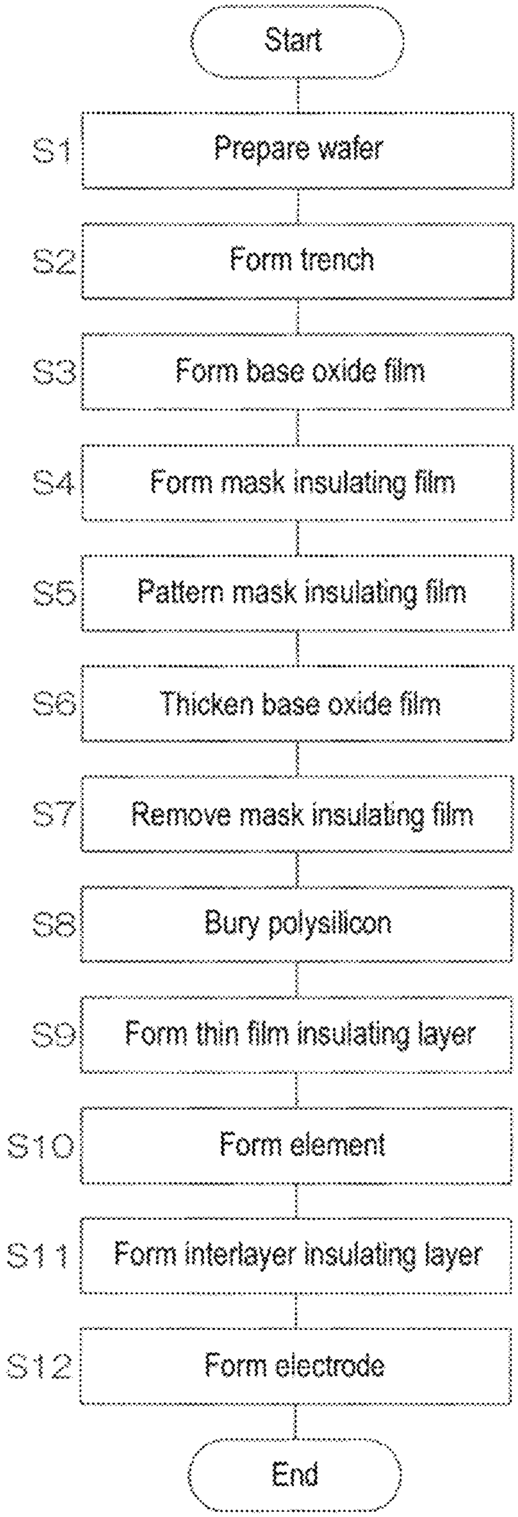
FIG. 12 is a diagram showing a manufacturing flow of the semiconductor device.

FIG. 12 is a diagram showing a manufacturing flow (first embodiment) of the semiconductor device 1. FIGS. 13A to 13E are schematic perspective views corresponding to FIG. 7 and showing steps related to formation of the first bridge insulating layer 79 of the semiconductor device 1. Although only the n-type MIS region 61 of the input region 13 is shown in FIGS. 13A to 13E, the same structure as the n-type MIS region 61 is formed in the p-type MIS region 62 as well.

Figure 13A:
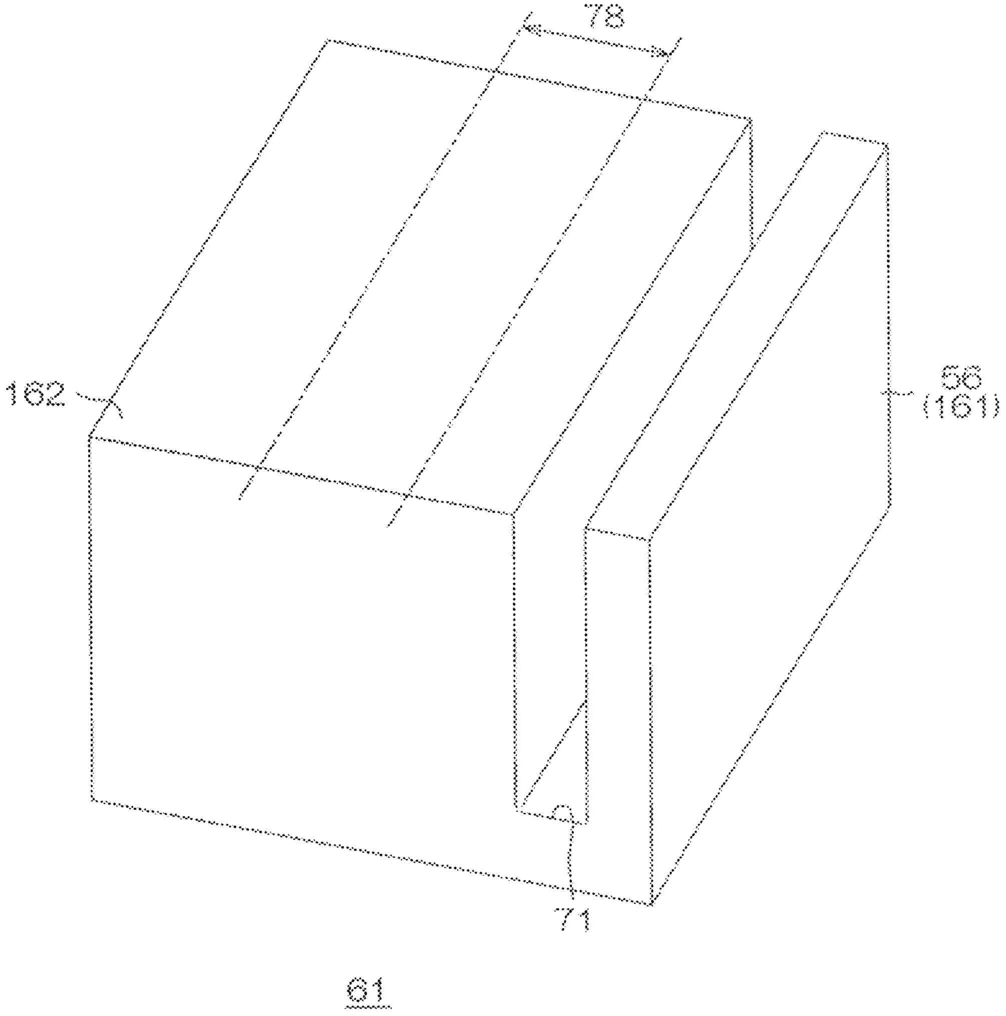
FIG. 13A is a schematic perspective view showing a process related to forming a bridge insulating layer of the semiconductor device.

In order to manufacture the semiconductor device 1, first, referring to FIG. 13A, one disc-shaped semiconductor wafer 161 is prepared (step S1). The semiconductor wafer 161 may be a semiconductor wafer made of silicon. The semiconductor wafer 161 becomes a base of the semiconductor layer 51. Next, a first etching mask (not shown) having a predetermined pattern is formed on a first main surface 162 of the semiconductor wafer 161. The first etching mask selectively has a plurality of openings which expose regions where the first trench 71, the second trench 101, and the gate trench 132 are to be formed.

Next, referring to FIG. 13A, the surface layer portion of the semiconductor wafer 161 is selectively removed by an etching method using the first etching mask. As a result, the first trench 71, the second trench 101, and the gate trench 132 are formed in the first main surface 162 of the semiconductor wafer 161 (step S2). The first trench 71 is merely shown in FIG. 13A. The n-type MIS region 61 is partitioned by the first trench 71, and the p-type MIS region 62 is partitioned by the second trench 101.

Figure 13B:
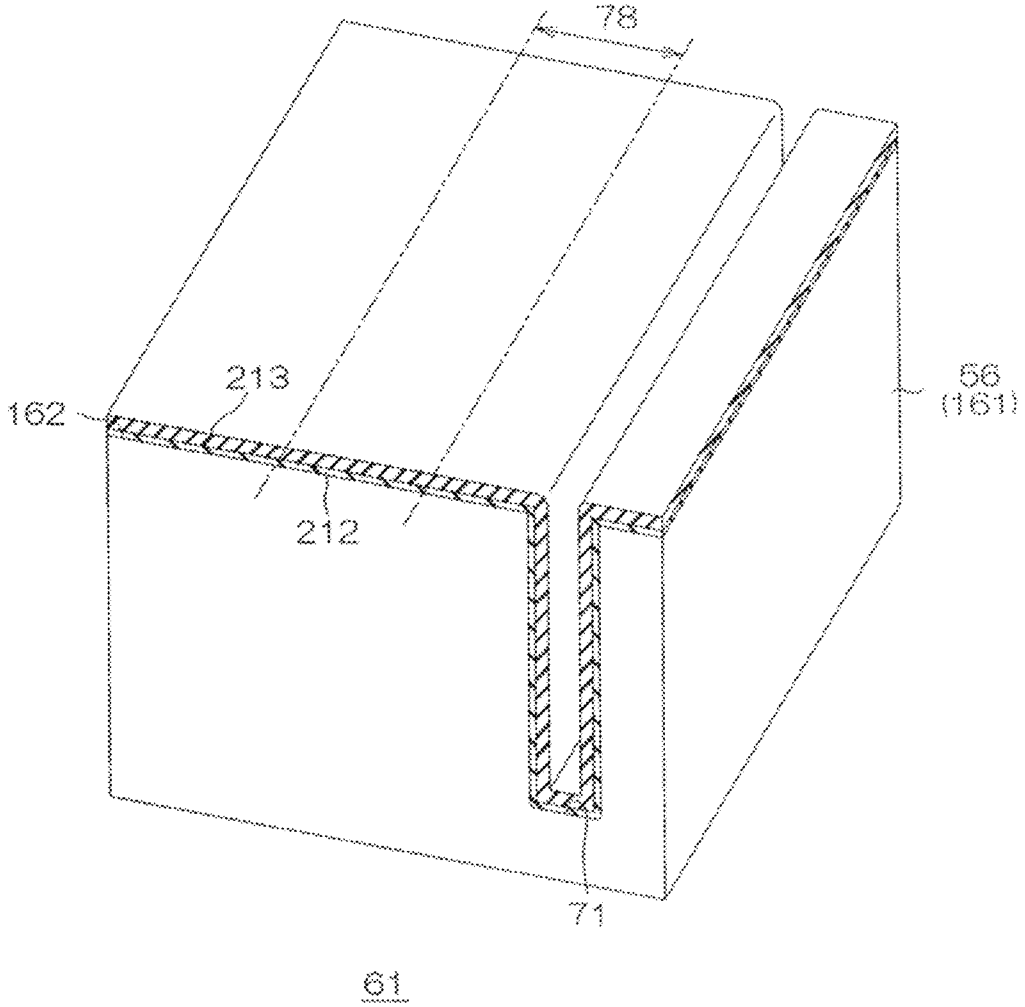
FIG. 13B is a cross-sectional view showing a step after FIG. 13A.

Next, referring to FIG. 13B, a base oxide film 212 is formed on the first main surface 162 of the semiconductor wafer 161 (step S3). The base oxide film 212 is formed along the first main surface 162 of the semiconductor wafer 161, the inner wall of the first trench 71, the inner wall of the second trench 101, and the inner wall of the gate trench 132. The base oxide film 212 may be made of silicon oxide. The base oxide film 212 may have a thickness of, for example, 300 Å or more and 600 Å or less. The base oxide film 212 may be formed by an oxidation treatment method (for example, a thermal oxidation treatment method). The base oxide film 212 may be formed by a chemical vapor deposition (CVD) method.

Next, referring to FIG. 13B, a mask insulating film 213 is formed on the base oxide film 212 (step S4). The mask insulating film 213 is formed over the entire first main surface 162 of the semiconductor wafer 161 so as to cover the entire base oxide film 212. The mask insulating film 213 is made of an insulating material different from that of the base oxide film 212. The mask insulating film 213 has a thickness larger than that of the base oxide film 212. The mask insulating film 213 may have a thickness of, for example, 1,000 Å or more and 2,000 Å or less. In this embodiment, the mask insulating film 213 may be made of silicon nitride. The mask insulating film 213 may be formed by a chemical vapor deposition (CVD) method.

Figure 13C:
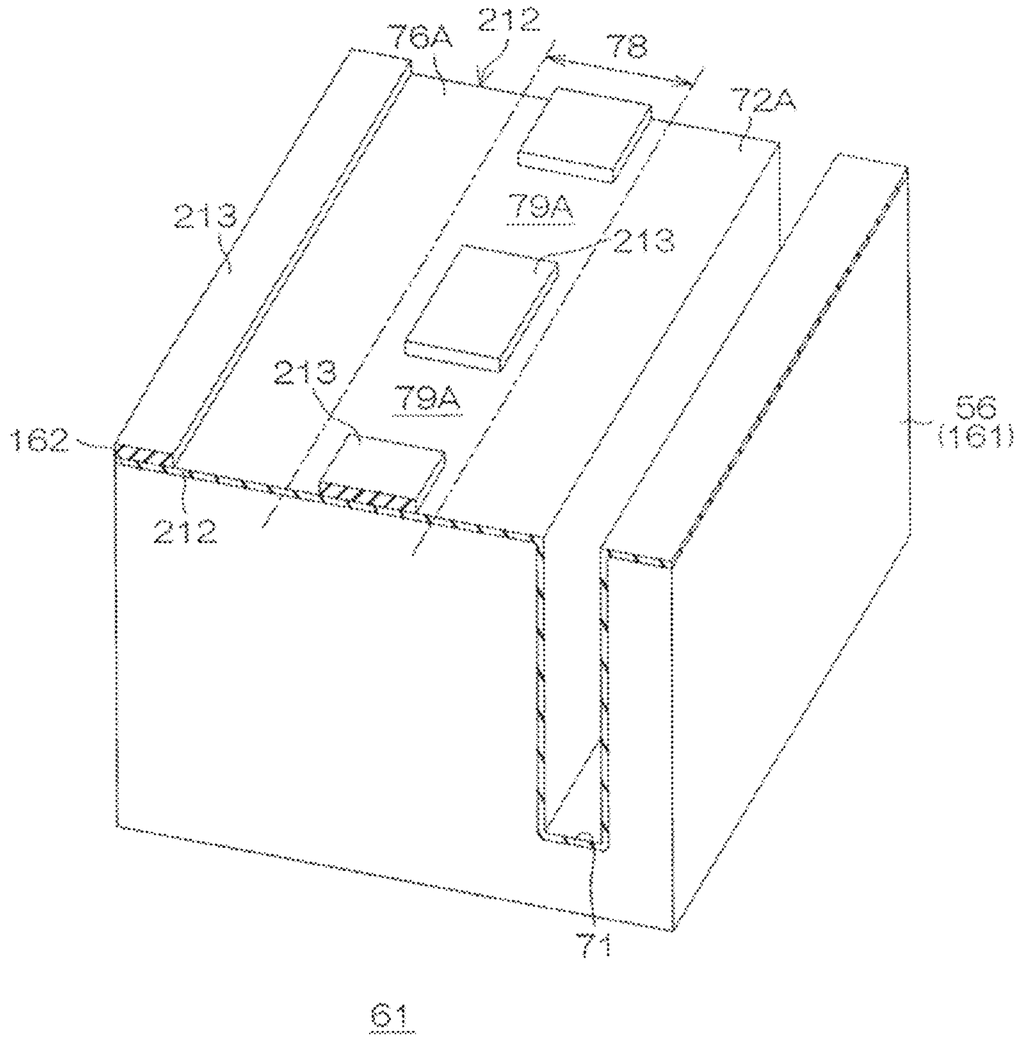
FIG. 13C is a cross-sectional view showing a step after FIG. 13B.

Next, referring to FIG. 13C, the mask insulating film 213 is patterned by being selectively etched (step S5). More specifically, a second etching mask (not shown) having a predetermined pattern is formed over the entire first main surface 162 of the semiconductor wafer 161 so as to cover the entire mask insulating film 213. The second etching mask selectively has openings for exposing portions of the base oxide film 212 as a field insulating portion 76A, a trench insulating portion 72A, and a bridge insulating portion 79A. The field insulating portion 76A, the trench insulating portion 72A, and the bridge insulating portion 79A correspond to the first field insulating layer 76, the first trench insulating layer 72, and the first bridge insulating layer 79, respectively. That is, the field insulating portion 76A covers a portion of the n-type MIS region 61 by being spaced apart from the first trench 71 toward the inner side of the n-type MIS region 61. The trench insulating portion 72A covers at least the inner wall of the first trench 71 and a portion of a predetermined width of the first main surface 162 drawn out from the first trench 71. The bridge insulating portion 79A covers the first intermediate region 78 annularly formed between the field insulating portion 76A and the trench insulating portion 72A. Then, the mask insulating film 213 is selectively removed by an etching method using the second etching mask. As a result, the field insulating portion 76A, the trench insulating portion 72A, and the bridge insulating portion 79A are exposed from the removed portion of the mask insulating film 213.

It is desirable to remove the mask insulating film 213 by isotropic etching. By adopting the isotropic etching, the mask insulating film 213, which is in the first trench 71, the second trench 101, and the gate trench 132, can be efficiently removed to leave the mask insulating film 213 as little as possible. The isotropic etching may include, for example, isotropic wet etching, isotropic chemical dry etching (CDE), and the like, and may be selected as appropriate.

Figure 13D:
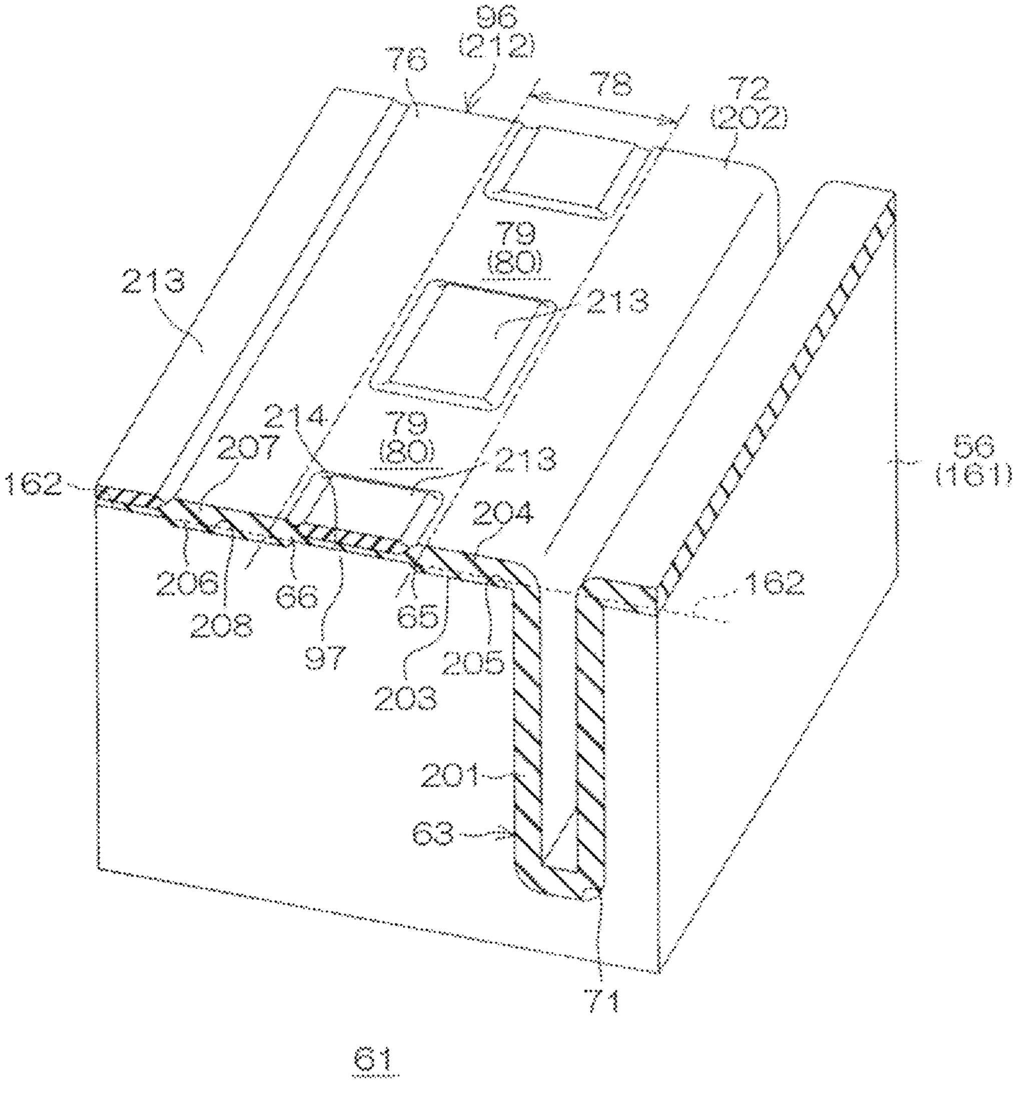
FIG. 13D is a cross-sectional view showing a step after FIG. 13C.

Next, referring to FIG. 13D, the base oxide film 212 is thickened (step S6). More specifically, a thermal oxidation process is performed on the base oxide film 212 in a state where the base oxide film 212 is selectively covered with the mask insulating film 213. Thereby, thermal oxidation progresses in the field insulating portion 76A, the trench insulating portion 72A, and the bridge insulating portion 79A of the base oxide film 212, which are selectively exposed from the mask insulating film 213, and portions 76A, 72A, and 79A are selectively thickened. As a result, the field insulating layer 96 including the first field insulating layer 76, the first trench insulating layer 72, and the first bridge insulating layer 79, which is formed in a LOCOS film, is formed. For example, the base oxide film 212 is thickened to a thickness of 2,000 Å or more and 4,000 Å or less. On the other hand, a thickness of a covering portion 214 of the base oxide film 212 covered with the mask insulating film 213 is maintained at the thickness (for example, 300 Å or more and 600 Å or less) during the initial thermal oxidation treatment (FIG. 13B).

Figure 13E:
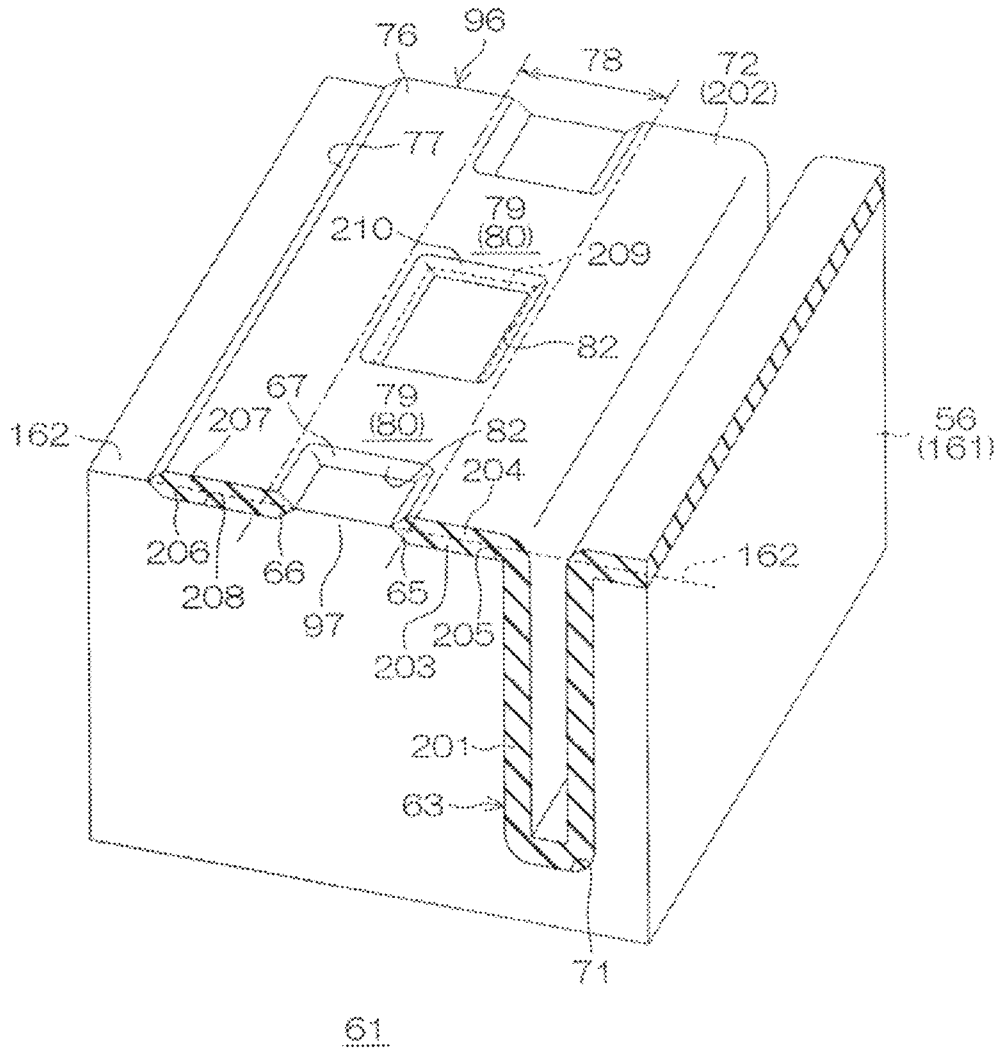
FIG. 13E is a cross-sectional view showing a step after FIG. 13D.

Next, referring to FIG. 13E, the mask insulating film 213 and the covering portion 214 of the base oxide film 212 are removed (step S7). For example, the mask insulating film 213 may be entirely etched using hot phosphoric acid and removed, and then, for example, the covering portion 214 of the base oxide film 212 may be etched using hydrofluoric acid and removed. Thereby, the first opening 77 and the first contact opening 82 are formed in a portion where the mask insulating film 213 is removed. At this time, the first field insulating layer 76, the first trench insulating layer 72, and the first bridge insulating layer 79 are also exposed to the etchant when the covering portion 214 is removed, but since these layers 72, 76, and 79 are much thicker than the covering portion 214, the film thicknesses thereof are just slightly reduced. Through the above steps, an insulating layer 165 in which the first field insulating layer 76, the first trench insulating layer 72, and the first bridge insulating layer 79 are integrally continuous is formed.

Although not shown, this insulating layer 165 is also formed in the p-type MIS region 62 and the output region 14. In the p-type MIS region 62, the insulating layer 165 is formed as a base insulating film for the second field insulating layer 106, the second trench insulating layer 102, and the second bridge insulating layer 109, and has the second opening 107 and the second contact opening 112. In the output region 14, the insulating layer 165 is formed as a base insulating film for the lower gate insulating layer 134.

Next, polysilicon is buried in the first trench 71, the second trench 101, and the gate trench 132 (step S8). Thereby, the first buried layer 73 and the second buried layer 103 are formed in the input region 13. On the other hand, the lower gate electrode layer 135 is formed in the gate trench 132 by removing an unnecessary portion of the polysilicon. After that, the insulating layer 165 is selectively removed from the output region 14 to form the lower gate electrode layer 135 having the convex portion 141 protruding upward from the upper end of the lower gate insulating layer 134.

Next, the first cap insulating layer 75, the second cap insulating layer 105, the first contact insulating layer 83, the second contact insulating layer 113, the first gate insulating layer 84, and the second gate insulating layer 114 are formed in the input region 13. Further, the intermediate insulating layer 138, the upper gate insulating layer 136, and the surface insulating layer 142 are formed in the output region 14. The formation of these thin film insulating layers (step S9) may be performed simultaneously by a common oxidation treatment method (for example, a thermal oxidation treatment method). Further, some or all of these insulating layers may be formed at different timings by different oxidation treatment methods. The step of forming the insulating layers may be performed by a CVD method.

Next is an element-forming step (step S10). In the element-forming step, for example, first, the upper gate electrode layer 137 is formed in the output region 14 by burying polysilicon in the output region 14. Next, the third cap insulating layer 144 is formed on the exposed surface of the upper gate electrode layer 137. The third cap insulating layer 144 may be a native oxide film, or may be formed by oxidation treatment. Next, in the input region 13, n-type impurities and p-type impurities are selectively introduced into a surface layer portion of the first main surface 162 of the semiconductor wafer 161 by an ion implantation method using an ion implantation mask. As a result, the p-type well region 85, the $p^+$-type contact region 87, the $n^+$-type source region 88, the $n^+$-type drain region 89, the p-type well region 115, the n-type well region 116, the $p^+$-type contact region 117, the $p^+$-type source region 118, and the $p^+$-type drain region 119 are formed in the input region 13. Further, in the output region 14, n-type impurities and p-type impurities are selectively introduced into a surface layer portion of the first main surface 162 of the semiconductor wafer 161 by an ion implantation method using an ion implantation mask. As a result, the p-type body region 145, the $n^+$-type source region 146, and the $p^+$-type contact region 147 are formed in the output region 14.

Further, an etching step is performed at least once in this element-forming step. The etching step includes, for example, a step of patterning polysilicon for the upper gate electrode layer 137. At this time, since the field insulating layer 96 is also exposed to an etchant or the like, it is slightly etched. As a result, the thicknesses T2, T5, and T8 of the field insulating layer 96 are smaller than the thickness T1 of the trench inner covering portion 201 in the first trench 71.

Next, the interlayer insulating layer 95 is formed on the first main surface 162 of the semiconductor wafer 161 (step S11). Next, the first gate electrode 90, the first contact electrode 91, the first source electrode 92, the first drain electrode 93, the second gate electrode 120, the second contact electrode 121, the second source electrode 122, the second drain electrode 123, the source pad electrode 150, and the like are buried in the interlayer insulating layer 95 (step S12). Thereafter, the surface of the interlayer insulating layer 95 is ground. The surface of the interlayer insulating layer 95 may be ground by a CMP method. The semiconductor device 1 is manufactured through the steps described above.

According to the method relating to the first embodiment, the field insulating layer 96 including the first field insulating layer 76, the first trench insulating layer 72, and the first bridge insulating layer 79 is formed by a LOCOS method. In other words, an active region, which is exposed from the first opening 77 and the first contact opening 82 of the field insulating layer 96, is formed in a region covered with the mask insulating film 213. Therefore, it is possible to improve the dimension controllability at the time of forming the active region, as compared with the related art.

For example, in the method described in the related art, an opening such as a contact opening is formed by wet etching of an insulating layer formed over the entire surface of a semiconductor wafer. Although an active region can be formed by this method, since the etching progresses in the lateral direction from the opening of a resist (etching mask) at the same speed as in the downward direction, it is necessary to set a dimensional margin in the etching mask in consideration of the etching in the lateral direction. On the other hand, if the dimensional margin is too small, the etching in the lateral direction may reduce the contact area between the insulating layer and the resist, which may result in adhesion failure such as peeling of the resist. Therefore, a certain amount of dimensional margin is essential, which is an obstacle to promotion of miniaturization. In contrast, according to the method of the present disclosure, since the field insulating layer 96 is formed by thickening by the LOCOS method, the dimension controllability of the peripheral edge portion of the field insulating layer 96 is excellent. As a result, it is possible to provide the semiconductor device 1 which is more miniaturized than ever before.

Further, the field insulating layer 96 is partially buried in the first main surface 52, as buried portions (in this embodiment, the first buried portion 203, the first field buried portion 206, and the first bridge buried portion 209). As a result, the step difference between the first main surface 52 (a silicon surface of the semiconductor layer 51) and the upper surface of the field insulating layer 96 can be made smaller than the actual thickness of the field insulating layer 96. For example, referring to FIGS. 5 and 6, the step differences S2, S4, and S6 between first main surface 52 (the silicon surface of the semiconductor layer 51) and the upper surface of the field insulating layer 96 can be made smaller than the thicknesses T2, T5, and T8 of the field insulating layer 96. As a result, it is possible to alleviate a problem in which a portion of a deposited structure (for example, gate material, etc.) formed in a step after the formation of the field insulating layer 96 remains.

Since the step difference between the first main surface 52 and the upper surface of the field insulating layer 96 can be reduced, the thickness T11 of the interlayer insulating layer 95 can be reduced. Therefore, the length of contact electrodes such as the first contact electrode 91, the first source electrode 92, and the first drain electrode 93 (the length of the interlayer insulating layer 95 in the thickness direction) can be shortened. As a result, the on-resistance of MISFET can be reduced. Further, when resistor elements and diode elements are formed on the field insulating layer 96, it is necessary to form contacts for these elements on the interlayer insulating layer 95. If the interlayer insulating layer 95 is thin, an aspect ratio of the contacts for the elements can be lowered, so that the contacts can be easily formed. In particular, as the miniaturization of semiconductor devices progresses, since the wiring width of contacts and the like becomes smaller, the low aspect ratio of buried contacts has an effective effect.

[Second Embodiment of Manufacturing Flow]

Figure 14:
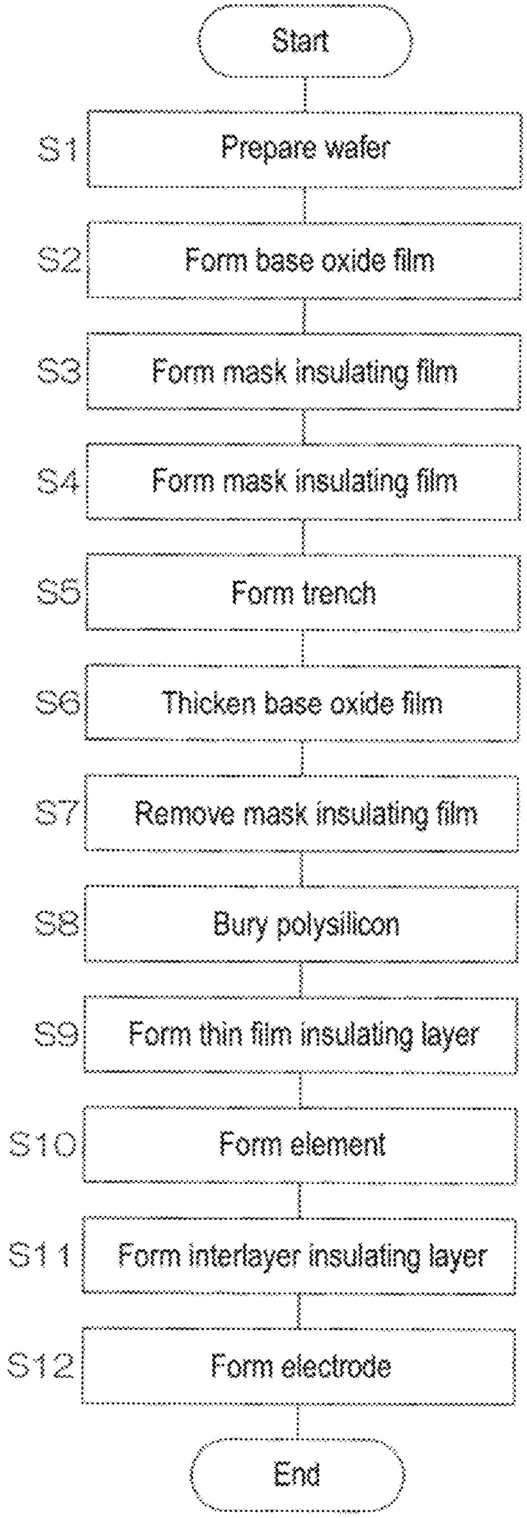
FIG. 14 is a diagram showing a manufacturing flow of the semiconductor device.

FIG. 14 is a diagram showing a manufacturing flow (second embodiment) of the semiconductor device 1. FIGS. 15A to 15E are schematic perspective views corresponding to FIG. 7 and showing steps related to formation of the first bridge insulating layer 79 of the semiconductor device 1. Although only the n-type MIS region 61 of the input region 13 is shown in FIGS. 15A to 15E, the same structure as the n-type MIS region 61 is formed in the p-type MIS region 62 as well.

Figure 15A:
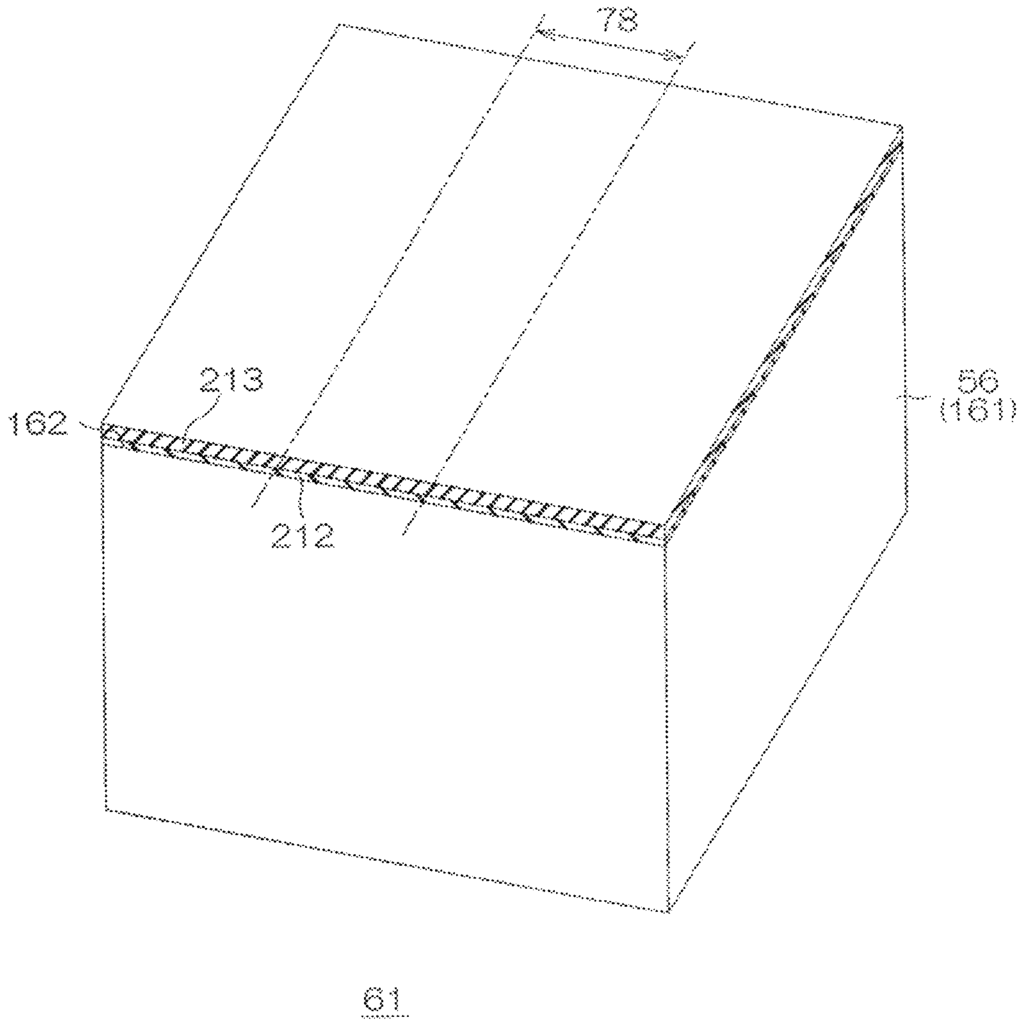
FIG. 15A is a schematic perspective view showing a process related to forming a bridge insulating layer of the semiconductor device.

In order to manufacture the semiconductor device 1, first, referring to FIG. 15A, one disc-shaped semiconductor wafer 161 is prepared (step S1). The semiconductor wafer 161 may be a semiconductor wafer made of silicon. The semiconductor wafer 161 becomes a base of the semiconductor layer 51. Next, a base oxide film 212 is formed on a first main surface 162 of the semiconductor wafer 161 (step S2). The base oxide film 212 is formed on the entire surface of the first main surface 162 of the semiconductor wafer 161 so as to cover the entire first main surface 162. The base oxide film 212 may be made of silicon oxide. The base oxide film 212 may have a thickness of, for example, 300 Å or more and 600 Å or less. The base oxide film 212 may be formed by an oxidation treatment method (for example, a thermal oxidation treatment method). The base oxide film 212 may be formed by a chemical vapor deposition (CVD) method.

Next, referring to FIG. 15A, a mask insulating film 213 is formed on the base oxide film 212 (step S3). The mask insulating film 213 is formed over the entire first main surface 162 of the semiconductor wafer 161 so as to cover the entire base oxide film 212. The mask insulating film 213 is made of an insulating material different from that of the base oxide film 212. The mask insulating film 213 has a thickness larger than that of the base oxide film 212. The mask insulating film 213 may have a thickness of, for example, 1,000 Å or more and 2,000 Å or less. In this embodiment, the mask insulating film 213 may be made of silicon nitride. The mask insulating film 213 may be formed by a chemical vapor deposition (CVD) method.

Figure 15B:
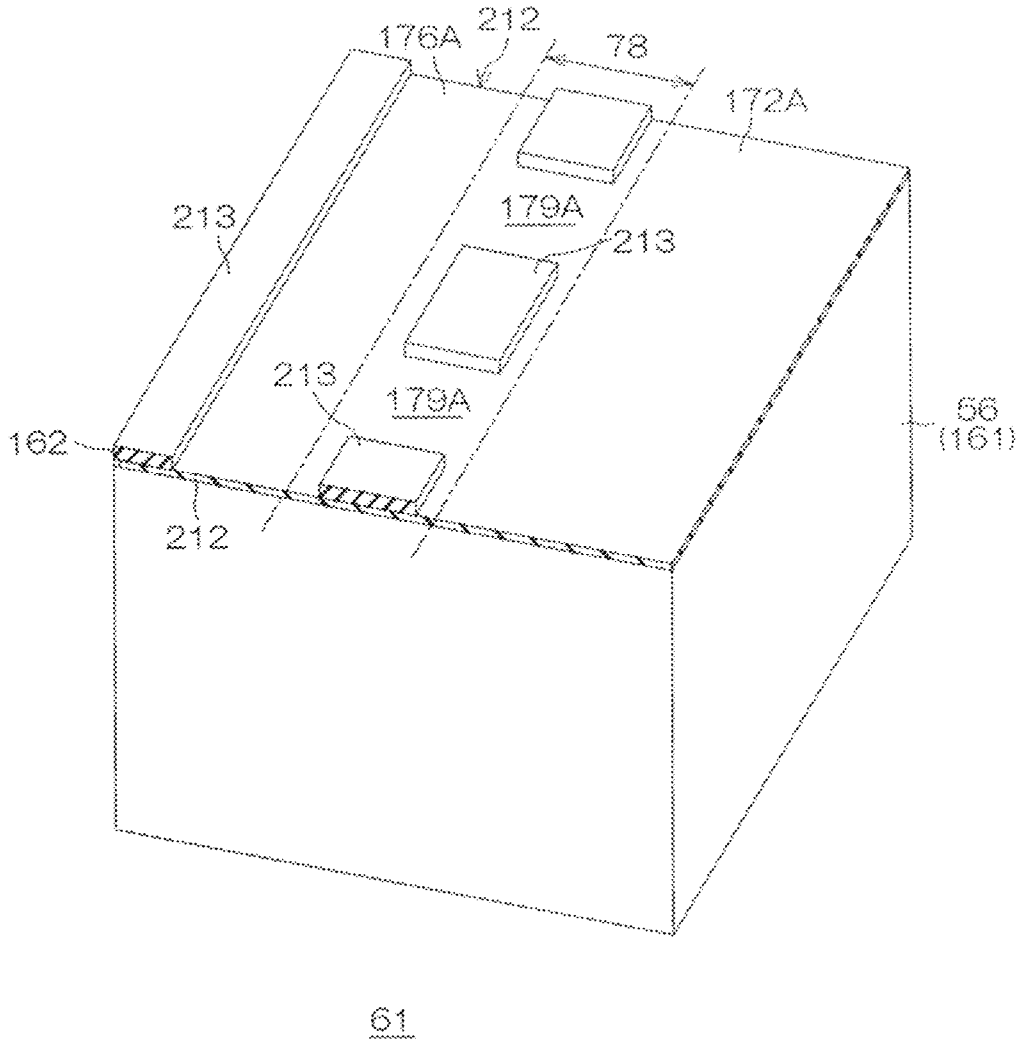
FIG. 15B is a cross-sectional view showing a step after FIG. 15A.

Next, referring to FIG. 15B, the mask insulating film 213 is patterned by being selectively etched (step S4). More specifically, a third etching mask (not shown) having a predetermined pattern is formed over the entire first main surface 162 of the semiconductor wafer 161 so as to cover the entire mask insulating film 213. The third etching mask selectively has openings for exposing portions of the base oxide film 212 as a first insulating portion 176A, a second insulating portion 172A, and a bridge insulating portion 179A. The first insulating portion 176A, the second insulating portion 172A, and the bridge insulating portion 179A correspond to the first field insulating layer 76, the first trench insulating layer 72 (the first field covering portion 202), and the first bridge insulating layer 79, respectively. That is, the second insulating portion 172A surrounds the first insulating portion 176A. The bridge insulating portion 179A partially connects the first insulating portion 176A and the second insulating portion 172A in the first intermediate region 78 between the first insulating portion 176A and the second insulating portion 172A. Then, the mask insulating film 213 is selectively removed by an etching method using the third etching mask. As a result, the first insulating portion 176A, the second insulating portion 172A, and the bridge insulating portion 179A are exposed from the removed portion of the mask insulating film 213.

It is desirable to remove the mask insulating film 213 by anisotropic etching. When anisotropic etching is used, the etching preferentially progresses downward and is less likely to progress laterally, so that the mask insulating film 213 can be removed so as to substantially match the mask pattern. That is, the dimension controllability at the time of patterning the mask insulating film 213 can be improved, and as a result, a shape of an active region can be accurately left under the remaining mask insulating film 213. The anisotropic etching may include, for example, reactive ion etching (RIE) and the like, and may be selected as appropriate.

Figure 15C:
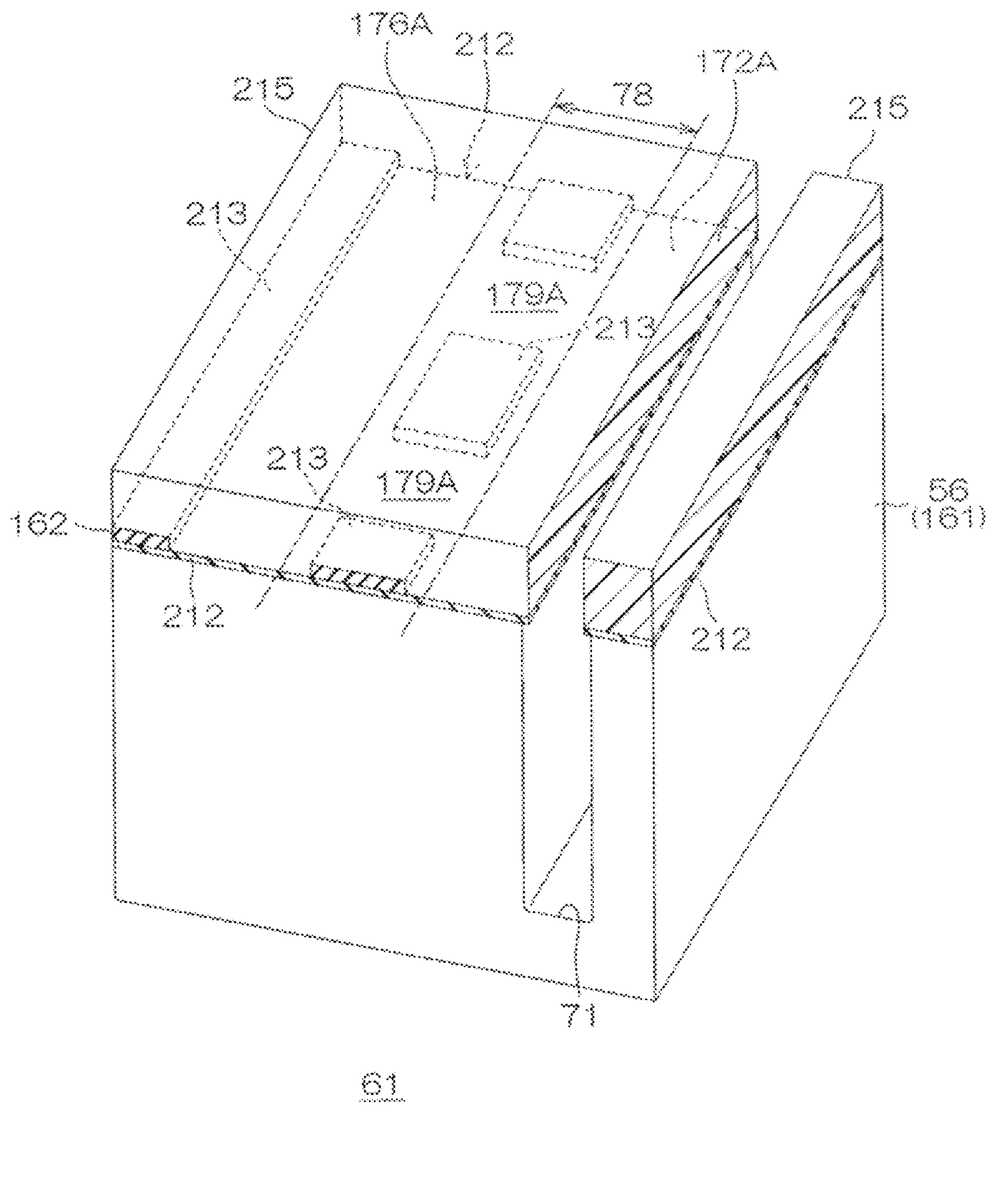
FIG. 15C is a cross-sectional view showing a step after FIG. 15B.

Next, referring to FIG. 15C, a fourth etching mask 215 having a predetermined pattern is formed on the first main surface 162 of the semiconductor wafer 161 so as to cover the base oxide film 212 and the mask insulating film 213. The fourth etching mask 215 selectively has a plurality of openings 216 which expose regions where the first trench 71, the second trench 101, and the gate trench 132 are to be formed. Next, after the mask insulating film 213 and the base oxide film 212 are removed in this order by an etching method using the fourth etching mask 215, the surface layer portion of the semiconductor wafer 161 is selectively removed. Thereby, the first trench 71, the second trench 101, and the gate trench 132 are formed in the first main surface 162 of the semiconductor wafer 161 (step S5). The first trench 71 is merely shown in FIG. 15C. The n-type MIS region 61 is partitioned by the first trench 71, and the p-type MIS region 62 is partitioned by the second trench 101. After the first trench 71, the second trench 101, and the gate trench 132 are formed, the fourth etching mask 215 is removed.

Figure 15D:
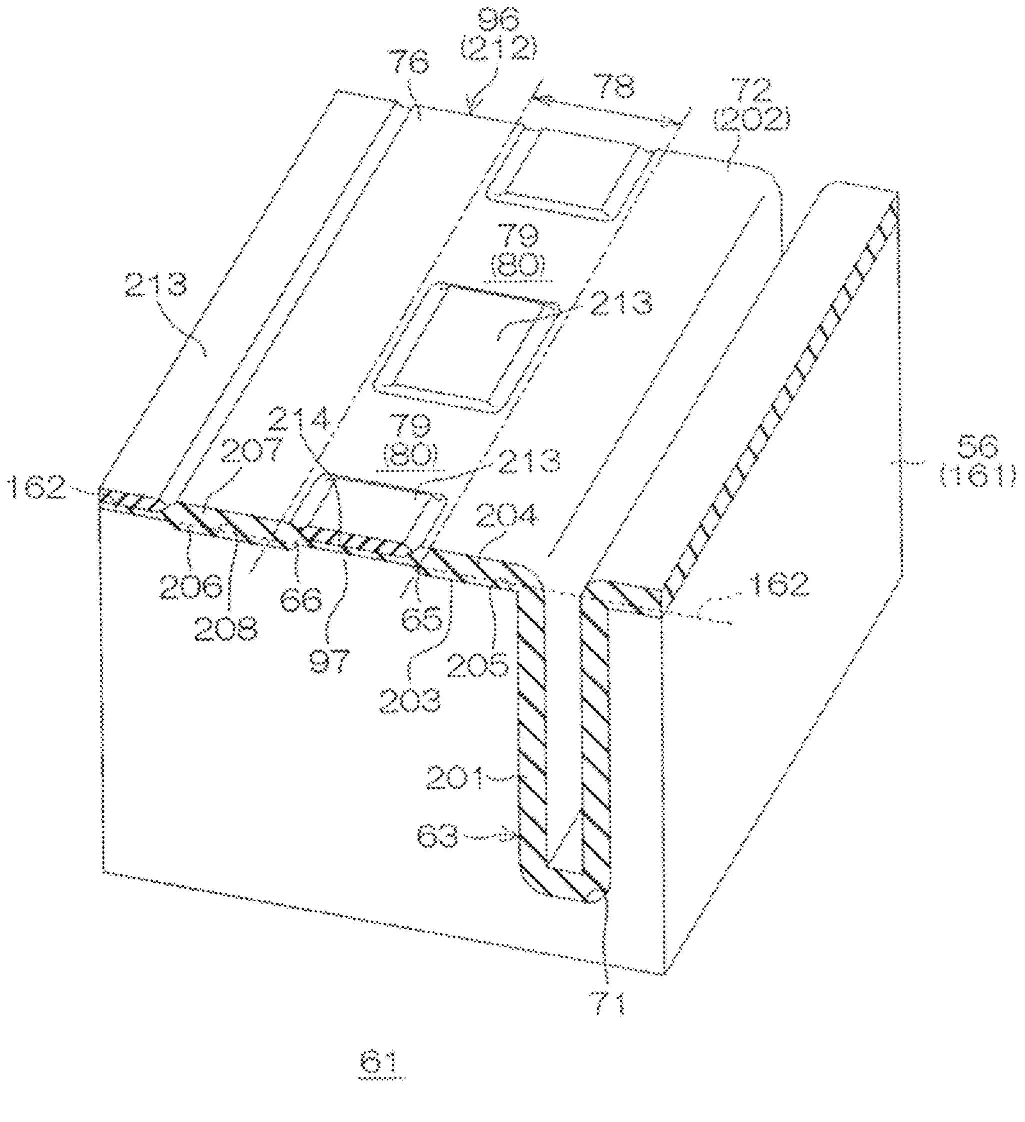
FIG. 15D is a cross-sectional view showing a step after FIG. 15C.

Next, referring to FIG. 15D, base oxide film 212 is thickened (step S6). More specifically, a thermal oxidation process is performed in a state where the base oxide film 212 is selectively covered with the mask insulating film 213 and the inner walls of the first trench 71, the second trench 101, and the gate trench 132 are exposed. As a result, thermal oxidation progresses in the first insulating portion 176A, the second insulating portion 172A, and the bridge insulating portion 179A of the base oxide film 212, which are selectively exposed from the mask insulating film 213, so that these portions 176A, 172A, and 179A are selectively thickened. Simultaneously with the thickening, an oxide film is also formed on inner walls of the first trench 71, the second trench 101, and the gate trench 132 by thermal oxidation and is integrated with the base oxide film 212. As a result, the field insulating layer 96 including the first field insulating layer 76, the first trench insulating layer 72, and the first bridge insulating layer 79, which is formed in a LOCOS film, is formed. For example, the base oxide film 212 is thickened to a thickness of 2,000 Å or more and 4,000 Å or less. On the other hand, the thickness of a covering portion 214 of the base oxide film 212 covered with the mask insulating film 213 is maintained at the thickness (for example, 300 Å or more and 600 Å or less) during the initial thermal oxidation treatment (FIG. 15A).

Figure 15E:
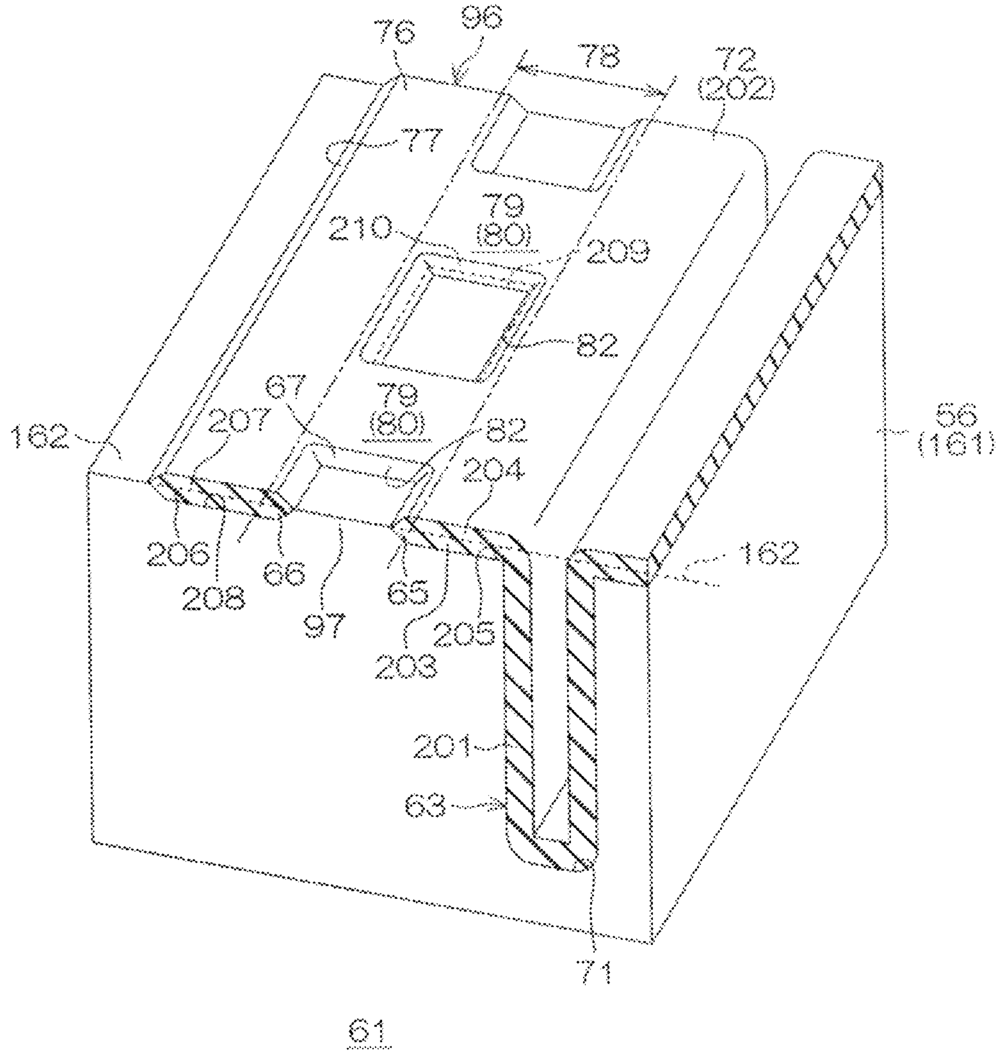
FIG. 15E is a cross-sectional view showing a step after FIG. 15D.

Next, referring to FIG. 15E, the mask insulating film 213 and the covering portion 214 of the base oxide film 212 are removed (step S7). For example, the mask insulating film 213 may be entirely etched using hot phosphoric acid and removed, and then, for example, the covering portion 214 of the base oxide film 212 may be etched using hydrofluoric acid and removed. Thereby, the first opening 77 and the first contact opening 82 are formed in a portion where the mask insulating film 213 is removed. At this time, the first field insulating layer 76, the first trench insulating layer 72, and the first bridge insulating layer 79 are also exposed to the etchant when the covering portion 214 is removed, but since these layers 72, 76, and 79 are much thicker than the covering portion 214, the film thicknesses thereof are just slightly reduced. Through the above steps, an insulating layer 165 in which the first field insulating layer 76, the first trench insulating layer 72, and the first bridge insulating layer 79 are integrally continuous is formed.

Although not shown, this insulating layer 165 is also formed in the p-type MIS region 62 and the output region 14. In the p-type MIS region 62, the insulating layer 165 is formed as a base insulating film for the second field insulating layer 106, the second trench insulating layer 102, and the second bridge insulating layer 109, and has the second opening 107 and the second contact opening 112. In the output region 14, the insulating layer 165 is formed as a base insulating film for the lower gate insulating layer 134.

Next, polysilicon is buried in the first trench 71, the second trench 101, and the gate trench 132 (step S8). Thereby, the first buried layer 73 and the second buried layer 103 are formed in the input region 13. On the other hand, the lower gate electrode layer 135 is formed in the gate trench 132 by removing an unnecessary portion of the polysilicon. After that, the insulating layer 165 is selectively removed from the output region 14 to form the lower gate electrode layer 135 having the convex portion 141 protruding upward from the upper end of the lower gate insulating layer 134.

Next, the first cap insulating layer 75, the second cap insulating layer 105, the first contact insulating layer 83, the second contact insulating layer 113, the first gate insulating layer 84, and the second gate insulating layer 114 are formed in the input region 13. Further, the intermediate insulating layer 138, the upper gate insulating layer 136, and the surface insulating layer 142 are formed in the output region 14. The formation of these thin film insulating layers (step S9) may be performed simultaneously by a common oxidation treatment method (for example, a thermal oxidation treatment method). Further, some or all of these insulating layers may be formed at different timings by different oxidation treatment methods. The step of forming the insulating layers may be performed by a CVD method.

Next is an element-forming step (step S10). In the element-forming step, for example, first, the upper gate electrode layer 137 is formed in the output region 14 by burying polysilicon in the output region 14. Next, the third cap insulating layer 144 is formed on the exposed surface of the upper gate electrode layer 137. The third cap insulating layer 144 may be a native oxide film, or may be formed by oxidation treatment. Next, in the input region 13, n-type impurities and p-type impurities are selectively introduced into a surface layer portion of the first main surface 162 of the semiconductor wafer 161 by an ion implantation method using an ion implantation mask. As a result, the p-type well region 85, the $p^+$-type contact region 87, the $n^+$-type source region 88, the $n^+$-type drain region 89, the p-type well region 115, the n-type well region 116, the $p^+$-type contact region 117, the $p^+$-type source region 118, and the $p^+$-type drain region 119 are formed in the input region 13. Further, in the output region 14, n-type impurities and p-type impurities are selectively introduced into a surface layer portion of the first main surface 162 of the semiconductor wafer 161 by an ion implantation method using an ion implantation mask. As a result, the p-type body region 145, the $n^+$-type source region 146, and the $p^+$-type contact region 147 are formed in the output region 14.

Further, an etching step is performed at least once in this element forming step. The etching step includes, for example, a step of patterning polysilicon for the upper gate electrode layer 137. At this time, since the field insulating layer 96 is also exposed to an etchant or the like, it is slightly etched. As a result, the thicknesses T2, T5, and T8 of the field insulating layer 96 are smaller than the thickness T1 of the trench inner covering portion 201 in the first trench 71.

Next, the interlayer insulating layer 95 is formed on the first main surface 162 of the semiconductor wafer 161 (step S11). Next, the first gate electrode 90, the first contact electrode 91, the first source electrode 92, the first drain electrode 93, the second gate electrode 120, the second contact electrode 121, the second source electrode 122, the second drain electrode 123, the source pad electrode 150, and the like are buried in the interlayer insulating layer 95 (step S12). Thereafter, the surface of the interlayer insulating layer 95 is ground. The surface of the interlayer insulating layer 95 may be ground by a CMP method. The semiconductor device 1 is manufactured through the steps described above.

Also by the method according to the second embodiment, the field insulating layer 96 including the first field insulating layer 76, the first trench insulating layer 72, and the first bridge insulating layer 79 is formed by a LOCOS method. Therefore, as in the flow of the first embodiment, it is possible to improve the dimension controllability at the time of forming the active region, as compared with the related art.

Further, in the flow of the second embodiment, the patterning step of the mask insulating film 213 is performed before forming a trench such as the first trench 71. Therefore, since it is not necessary to allow an etchant or the like to flow to an excess mask insulating film 213 which has entered a concave portion such as a trench, the mask insulating film 213 can be patterned by anisotropic etching. As a result, it is possible to further improve the dimensional accuracy of a shape of an active region.

Although the semiconductor device 1 according to the embodiment of the present disclosure has been described above, the semiconductor device 1 can also be implemented in other embodiments.

For example, in the above-described embodiment, a structure in which the conductivity type of each semiconductor portion is reversed may be adopted. That is, a p-type portion may be n-type, and an n-type portion may be p-type.

Further, the semiconductor layer 51 may have a single-layer structure including an n-type semiconductor substrate formed by an FZ (Floating Zone) method. The n-type semiconductor substrate may be a semiconductor substrate made of silicon. In this case, an $n^+$-type impurity region corresponding to the $n^+$-type semiconductor substrate 55 is formed by implanting an n-type impurity into the second main surface 53 of the semiconductor layer 51. Then, in the n-type semiconductor substrate, an n-type region other than the $n^+$-type impurity region becomes an n-type impurity region corresponding to the n-type epitaxial layer 56.

Further, in the above-described embodiment, the package type adopted for the semiconductor device 1 is not limited to the TO system represented by TO-220, TO-252, and the like. The package type of the semiconductor device 1 may include SOP (Small Outline Package), QFN (Quad For Non Lead Package), DFP (Dual Flat Package), DIP (Dual Inline Package), QFP (Quad Flat Package), SIP (Single Inline Package), SOJ (Small Outline J-leaded Package), and similar package types. An embodiment in which the SOP is applied to the semiconductor device 1 will be described below.

Figure 16:
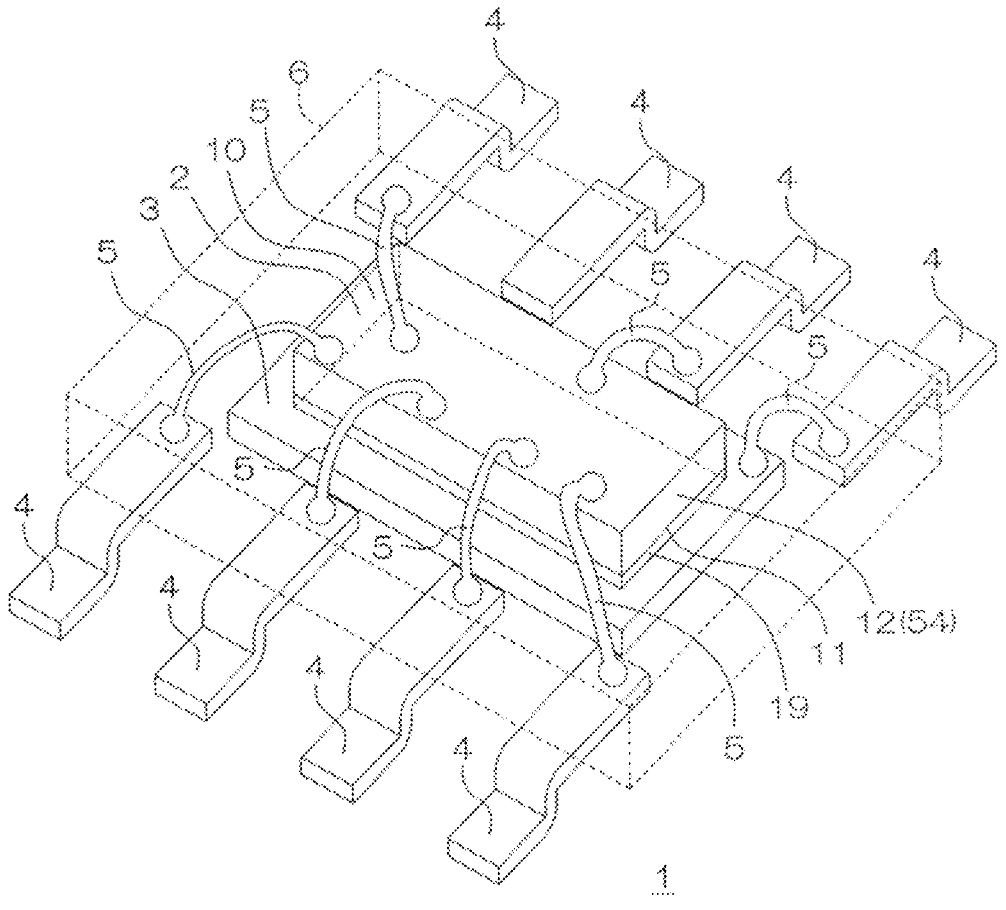
FIG. 16 is a perspective view showing an embodiment in which a different package type is applied to the semiconductor device of FIG. 1.
Figure 17:
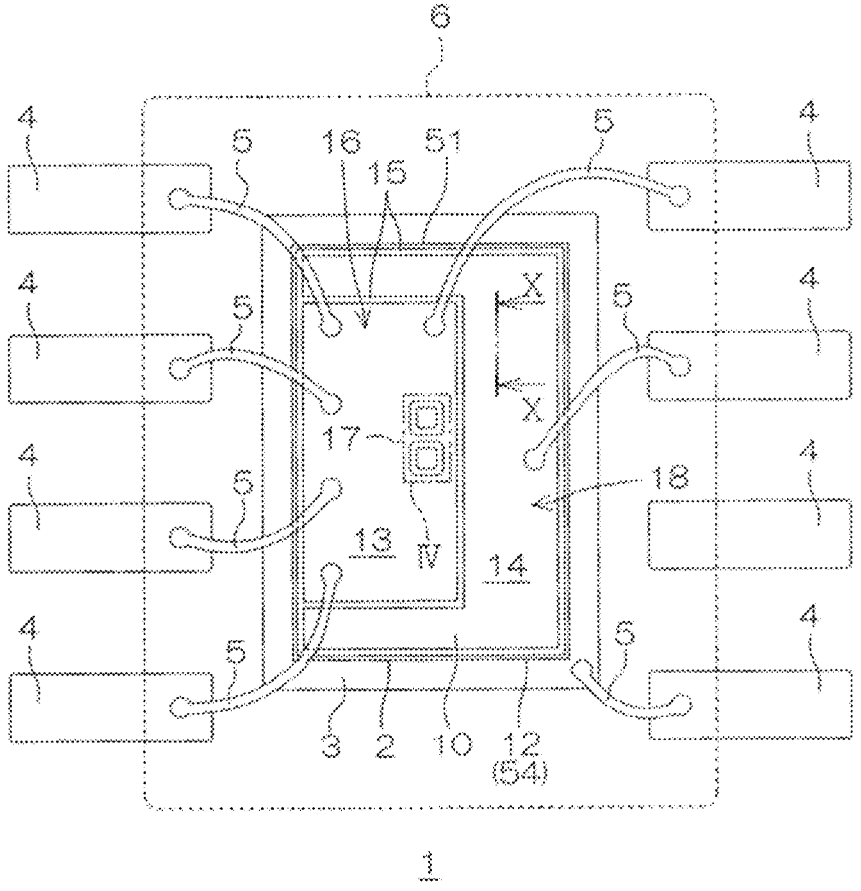
FIG. 17 is a plan view showing an internal structure of the semiconductor device of FIG. 16.

FIG. 16 is a perspective view showing an embodiment in which a different package type is applied to the semiconductor device 1 of FIG. 1, with the resin package 6 transparently shown. FIG. 17 is a plan view showing an internal structure of the semiconductor device 1 of FIG. 16.

In the following, the structures corresponding to those described for the semiconductor device 1 are denoted by the same reference numerals, and explanation thereof will be omitted.

Referring to FIGS. 16 and 17, in this embodiment, the semiconductor device 1 is an electronic component in which SOP is applied as a package type. The semiconductor device 1 includes an IPD chip 2, a die pad 3, a plurality of lead terminals 4 (eight lead terminals 4 in this embodiment), a plurality of conducting wires 5, and a resin package 6.

The die pad 3 supports the IPD chip 2 from the second chip main surface 11 side. The die pad 3 is formed in a rectangular parallelepiped shape. The IPD chip 2 is connected to the die pad 3 via a conductive bonding material 19.

The plurality of lead terminals 4 is provided around the die pad 3. Four lead terminals 4 out of the plurality of lead terminals 4 are arranged at intervals along one side of the die pad 3. The remaining four lead terminals 4 are arranged at intervals along the side opposite to the one side of the die pad 3.

Some of the plurality of lead terminals 4 may be electrically connected to arbitrary regions of the IPD chip 2 via the conducting wires 5. One or some of the plurality of lead terminals 4 may be electrically connected to the die pad 3 via the conducting wires 5.

The resin package 6 is formed in a rectangular parallelepiped shape. The resin package 6 seals the IPD chip 2, the die pad 3, and the plurality of lead terminals 4. The plurality of lead terminals 4 are drawn out from the inside of the resin package 6 to the outside thereof.

As others, it is possible to make various design changes within the scope of the matters described in the claims.

As described above, the embodiments of the present disclosure are illustrative in all respects and should not be construed as limited, and are intended to include modifications in all respects.

The following features can be extracted from the description of the present disclosure and drawings.

(Supplementary Note 1-1)

A semiconductor device (1) including:

- a semiconductor layer (51) having a partitioned region (61, 62) partitioned by a trench (71, 101);
- a field insulating layer (76, 106) which is formed on a main surface (52) of the semiconductor layer (51) at an interval from the trench (71, 101) toward an inner side of the partitioned region (61, 62) and covers the partitioned region (61, 62);
- a trench insulating layer (72, 102) formed at least in the trench (71, 101);

an intermediate region (78, 108) annularly formed between the field insulating layer (76, 106) on the main surface (52) of the semiconductor layer (51) and the trench insulating layer (72, 102); and a bridge insulating layer (79, 109) which is formed in the intermediate region (78, 108) and connects the field insulating layer (76, 106) and the trench insulating layer (72, 102), wherein the bridge insulating layer (79, 109) has a bridge buried portion (209, 309) buried in the main surface (52) of the semiconductor layer (51).

(Supplementary Note 1-2)

The semiconductor device (1) of Supplementary Note 1-1, wherein the bridge insulating layer (79, 109) has a peripheral edge portion including a bird's beak (67, 70).

(Supplementary Note 1-3)

The semiconductor device (1) of Supplementary Note 1-1 or 1-2, wherein the trench insulating layer (72, 102) includes a trench inner covering portion (201, 301) covering an inner wall of the trench (71, 101), and a field covering portion (202, 302) drawn out from the trench inner covering portion (201, 301) to the main surface (52) of the semiconductor layer (51) and connected to the field insulating layer (76, 106) via the bridge insulating layer (79, 109), wherein the field covering portion (202, 302) has a first buried portion (203, 303) buried in the main surface (52) of the semiconductor layer (51), wherein the field insulating layer (76, 106) has a second buried portion (206, 306) buried in the main surface (52) of the semiconductor layer (51), and wherein the bridge buried portion (209, 309), the first buried portion (203, 303), and the second buried portion (206, 306) are formed by a single buried portion which is integrally continuous in a direction along the main surface (52) of the semiconductor layer (51).

(Supplementary Note 1-4)

The semiconductor device (1) of Supplementary Note 1-3, wherein a plurality of bridge insulating layers (79, 109) is formed at intervals in an annular direction of the intermediate region (78, 108), and wherein the semiconductor device (1) further includes:

a mesa-shaped contact portion (97, 99) which is formed in the intermediate region (78, 108) and surrounded by the bridge buried portion (209, 309), the first buried portion (203, 303), and the second buried portion (206, 306); and a contact electrode (91, 121) connected to the contact portion (97, 99).

(Supplementary Note 1-5)

The semiconductor device (1) of Supplementary Note 1-4, wherein a plurality of contact portions (97, 99) is formed at equal intervals in the annular direction of the intermediate region (78, 108).

(Supplementary Note 1-6)

The semiconductor device (1) of any one of Supplementary Notes 1-3 to 1-5, wherein the bridge insulating layer (79, 109) has a thickness (T8, T19) smaller than a thickness (T1) of the trench inner covering portion (201, 301).

(Supplementary Note 1-7)

The semiconductor device (1) of Supplementary Note 1-6, wherein the thickness (T1) of the trench inner covering portion (201, 301) is 2,000 Å or more and 4,000 Å or less, and wherein the thickness (T8, T19) of the bridge insulating layer (79, 109) is 1,000 Å or more and 3,000 Å or less.

(Supplementary Note 1-8)

The semiconductor device (1) of any one of Supplementary Notes 1-1 to 1-7, wherein the semiconductor layer (51) is in contact with a bottom of the bridge buried portion (209, 309) and has a low step surface (211, 311) having a step difference with respect to the main surface (52) of the semiconductor layer (51), and wherein the step difference (S5, S11) between the main surface (52) of the semiconductor layer (51) and the low step surface (211, 311) of the semiconductor layer (51) is 1,000 Å or more and 1,500 Å or less.

(Supplementary Note 1-9)

The semiconductor device (1) of any one of Supplementary Notes 1-1 to 1-8, further including: an interlayer insulating layer (95) which is formed on the main surface (52) of the semiconductor layer (51) and covers the field insulating layer (76, 106) and the bridge insulating layer (79, 109), wherein the interlayer insulating layer (95) has a thickness (T11) of 6,000 Å or more and 10,000 Å or less.

(Supplementary Note 1-10)

The semiconductor device (1) of any one of Supplementary Notes 1-1 to 1-9, wherein the field insulating layer (76, 106), the trench insulating layer (72, 102), and the bridge insulating layer (79, 109) are formed by one insulating layer (96, 98) which extends continuously.

(Supplementary Note 1-11)

The semiconductor device (1) of any one of Supplementary Notes 1-1 to 1-10, wherein an opening (77, 107) is formed in the field insulating layer (76, 106).

(Supplementary Note 1-12)

The semiconductor device (1) of Supplementary Note 1-11, wherein the partitioned region (61, 62) is an active region including an insulated gate transistor, and wherein a gate insulating layer (84, 114) of the transistor is formed in the opening (77, 107) of the field insulating layer (76, 106).

(Supplementary Note 1-13)

The semiconductor device (1) of any one of Supplementary Notes 1-1 to 1-12, wherein the trench insulating layer (72, 102) is formed in a film shape along the inner wall of the trench (71, 101) so as to partition a concave space within the trench (71, 101).

(Supplementary Note 1-14)

The semiconductor device (1) of Supplementary Note 1-13, further including: a buried layer (73, 103) buried in the concave space partitioned by the trench insulating layer (72, 102) within the trench (71, 101).

(Supplementary Note 1-15)

The semiconductor device (1) of Supplementary Note 1-14, wherein the buried layer (73, 103) contains polysilicon.

(Supplementary Note 1-16)

The semiconductor device (1) of any one of Supplementary Notes 1-1 to 15, wherein the trench (71, 101) is formed in an annular shape in a plan view seen in a normal direction of the main surface (52) of the semiconductor layer (51).

(Supplementary Note 1-17)

A method of manufacturing a semiconductor device (1), including:

forming a partitioned region (61, 62) partitioned by a trench (71, 101) in a semiconductor layer (51, 161) by selectively forming the trench (71, 101) in the semiconductor layer (51, 161);

forming a base oxide film (212) on an inner wall of the trench (71, 101) and a main surface (52, 162) of the semiconductor layer (51, 161) by thermal oxidation;

covering the entire base oxide film (212) with a mask insulating film (213) made of a material different from a material of the base oxide film (212);

exposing portions of the base oxide film (212), as a field insulating portion (76A), a trench insulating portion (72A), and a bridge insulating portion (79A), from the mask insulating film (213) by selectively removing the mask insulating film (213), wherein the field insulating portion (76A) covers a portion of the partitioned region (61, 62) which is spaced apart from the trench (71, 101) toward an inner side of the partitioned region (61, 62), the trench insulating portion (72A) covers at least an inner wall of the trench (71, 101), and the bridge insulating portion (79A) selectively covers an intermediate region (78, 108) of the semiconductor layer (51, 161) which is annularly formed between the field insulating portion (76A) and the trench insulating portion (72A);

selectively thickening the field insulating portion (76A), the trench insulating portion (72A), and the bridge insulating portion (79A) in the base oxide film (212) by thermal oxidation; and removing the mask insulating film (213) after thickening the base oxide film (212).

(Supplementary Note 1-18)

The method of Supplementary Note 1-17, wherein the act of exposing the portion of the base oxide film (212) includes removing the mask insulating film (213) by isotropic etching.

(Supplementary Note 1-19)

A method of manufacturing a semiconductor device (1), including:

forming a base oxide film (212) on a main surface (52, 162) of a semiconductor layer (51, 161) by thermal oxidation;

covering the entire base oxide film (212) with a mask insulating film (213) made of a material different from that of the base oxide film (212);

exposing portions of the base oxide film (212), as a first insulating portion (176A), a second insulating portion (172A), and a bridge insulating portion (179A), from the mask insulating film (213) by selectively removing the mask insulating film (213), wherein the second insulating portion (172A) surrounds the first insulating portion (176A) and the bridge insulating portion (179A) partially connects the first insulating portion (176A) and the second insulating portion (172A);

forming a trench (71, 101) in the semiconductor layer (51, 161) by selectively removing a portion of the second insulating portion (172A) and a region of the semiconductor layer (51, 161) covered by the portion of the second insulating portion (172A), and forming a partitioned region (61, 62) partitioned by the trench (71, 101) in the semiconductor layer (51, 161);

selectively thickening the first insulating portion (176A), the bridge insulating portion (179A), and the remaining portion of the second insulating portion (172A), which is not removed in the forming the trench (71, 101), in the base oxide film (212) by thermal oxidation, and forming a trench inner covering portion (201, 301) on an inner wall of the trench (71, 101); and removing the mask insulating film (213) after thickening the base oxide film (212) and forming the trench inner covering portion (201, 301).

(Supplementary Note 1-20)

The method of Supplementary Note 1-19, wherein the act of removing the mask insulating film (213) includes removing the mask insulating film (213) by anisotropic etching.

According to the present disclosure in some embodiments, it is possible to provide a semiconductor device capable of suppressing crystal defects in a semiconductor layer and achieving miniaturization.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device comprising:

a semiconductor layer having a partitioned region partitioned by a trench;

a field insulating layer which is formed on a main surface of the semiconductor layer at an interval from the trench toward an inner side of the partitioned region and covers the partitioned region;

a trench insulating layer formed at least in the trench;

an intermediate region annularly formed between the field insulating layer on the main surface of the semiconductor layer and the trench insulating layer; and a bridge insulating layer which is formed in the intermediate region and connects the field insulating layer and the trench insulating layer, wherein the bridge insulating layer has a bridge buried portion buried in the main surface of the semiconductor layer, wherein the trench insulating layer includes a trench inner covering portion covering an inner wall of the trench, and a field covering portion drawn out from the trench inner covering portion to the main surface of the semiconductor layer and connected to the field insulating layer via the bridge insulating layer, the field covering portion has a first buried portion buried in the main surface of the semiconductor layer, the field insulating layer has a second buried portion buried in the main surface of the semiconductor layer, and the bridge buried portion, the first buried portion, and the second buried portion are formed by a single buried portion which is integrally continuous in a direction along the main surface of the semiconductor layer.

2. The semiconductor device of claim 1, wherein the bridge insulating layer has a peripheral edge portion including a bird's beak.

3. The semiconductor device of claim 1, wherein a plurality of bridge insulating layers is formed at intervals in an annular direction of the intermediate region, and wherein the semiconductor device further comprises:

a mesa-shaped contact portion which is formed in the intermediate region and surrounded by the bridge buried portion, the first buried portion, and the second buried portion; and a contact electrode connected to the contact portion.

4. The semiconductor device of claim 3, wherein a plurality of contact portions is formed at equal intervals in the annular direction of the intermediate region.

5. The semiconductor device of claim 1, wherein the bridge insulating layer has a thickness smaller than a thickness of the trench inner covering portion.

6. The semiconductor device of claim 5, wherein the thickness of the trench inner covering portion is 2,000 Å or more and 4,000 Å or less, and wherein the thickness of the bridge insulating layer is 1,000 Å or more and 3,000 Å or less.

7. The semiconductor device of claim 1, wherein the semiconductor layer is in contact with a bottom of the bridge buried portion and has a low step surface having a step difference with respect to the main surface of the semiconductor layer, and wherein the step difference between the main surface of the semiconductor layer and the low step surface of the semiconductor layer is 1,000 Å or more and 1,500 Å or less.

8. The semiconductor device of claim 1, further comprising: an interlayer insulating layer which is formed on the main surface of the semiconductor layer and covers the field insulating layer and the bridge insulating layer, wherein the interlayer insulating layer has a thickness of 6,000 Å or more and 10,000 Å or less.

9. The semiconductor device of claim 1, wherein the field insulating layer, the trench insulating layer, and the bridge insulating layer are formed by one insulating layer which extends continuously.

10. The semiconductor device of claim 1, wherein an opening is formed in the field insulating layer.

11. The semiconductor device of claim 10, wherein the partitioned region is an active region including an insulated gate transistor, and wherein a gate insulating layer of the insulated gate transistor is formed in the opening of the field insulating layer.

12. The semiconductor device of claim 1, wherein the trench insulating layer is formed in a film shape along an inner wall of the trench so as to partition a concave space within the trench.

13. The semiconductor device of claim 12, further comprising: a buried layer buried in the concave space partitioned by the trench insulating layer within the trench.

14. The semiconductor device of claim 13, wherein the buried layer contains polysilicon.

15. The semiconductor device of claim 1, wherein the trench is formed in an annular shape in a plan view seen in a normal direction of the main surface of the semiconductor layer.

* * * * *